(12) United States Patent
Sen

(10) Patent No.: US 11,107,716 B1
(45) Date of Patent: Aug. 31, 2021

(54) AUTOMATION LINE FOR PROCESSING A MOLDED PANEL

(71) Applicant: PYXIS CF PTE. LTD., Singapore (SG)

(72) Inventor: Amlan Sen, Singapore (SG)

(73) Assignee: PYXIS CF PTE. LTD., Singapore (SG)

( * ) Notice: Subject to any disclaimer, the term of this patent is extended or adjusted under 35 U.S.C. 154(b) by 0 days.

(21) Appl. No.: 16/783,385

(22) Filed: Feb. 6, 2020

(51) Int. Cl.
| | |
|---|---|
| B32B 43/00 | (2006.01) |
| H01L 21/677 | (2006.01) |
| H01L 21/67 | (2006.01) |
| H01L 21/683 | (2006.01) |
| H01L 21/673 | (2006.01) |
| H01L 23/60 | (2006.01) |
| H01L 21/68 | (2006.01) |
| H01L 21/687 | (2006.01) |
| B32B 38/10 | (2006.01) |

(52) U.S. Cl.
CPC .. *H01L 21/67706* (2013.01); *H01L 21/67103* (2013.01); *H01L 21/67173* (2013.01); *H01L 21/67259* (2013.01); *H01L 21/67333* (2013.01); *H01L 21/68* (2013.01); *H01L 21/6835* (2013.01); *H01L 21/6838* (2013.01); *H01L 21/68707* (2013.01); *H01L 23/60* (2013.01); *B32B 38/10* (2013.01); *B32B 43/006* (2013.01); *H01L 2221/68381* (2013.01); *Y10T 156/1153* (2015.01); *Y10T 156/1911* (2015.01)

(58) Field of Classification Search
CPC . B32B 43/006; B32B 38/10; Y10T 156/1153; Y10T 156/1911
See application file for complete search history.

(56) References Cited

U.S. PATENT DOCUMENTS

| | | | | |
|---|---|---|---|---|
| 9,960,069 | B2 * | 5/2018 | Sugihara | H01L 21/67092 |
| 2003/0168145 | A1 * | 9/2003 | Suga | H01L 21/67092 |
| | | | | 156/60 |
| 2004/0171231 | A1 * | 9/2004 | Yanagita | H01L 21/02052 |
| | | | | 438/455 |
| 2006/0231202 | A1 * | 10/2006 | Sakata | B29C 63/0013 |
| | | | | 156/716 |
| 2008/0213975 | A1 * | 9/2008 | Yang | B28D 5/0082 |
| | | | | 438/460 |
| 2011/0010908 | A1 * | 1/2011 | George | B32B 43/006 |
| | | | | 29/426.2 |

(Continued)

*Primary Examiner* — Mark A Osele
*Assistant Examiner* — Nickolas R Harm
(74) *Attorney, Agent, or Firm* — Daniel F. Nesbitt; Hasse & Nesbitt LLC

(57) ABSTRACT

An automation line for processing a molded panel which is attached, via thermal release adhesive, to a first carrier. The automation line including a release workstation which includes a release unit having a carrier-engagement arrangement movable to engage the first carrier. The carrier-engagement arrangement includes a heating sub-arrangement to thermally contact the first carrier and an attachment sub-arrangement to attach the first carrier to the carrier-engagement arrangement, wherein the carrier-engagement arrangement is operable to heat the intermediate panel assembly to a release temperature of the thermal release adhesive and to separate the first carrier from the molded panel.

19 Claims, 15 Drawing Sheets

(56) References Cited

U.S. PATENT DOCUMENTS

| | | | |
|---|---|---|---|
| 2011/0297329 A1* | 12/2011 | Canale | H01L 21/67253 156/756 |
| 2012/0186052 A1* | 7/2012 | Neuhoff | H01L 21/6715 29/25.01 |
| 2013/0048222 A1* | 2/2013 | Tanaka | H01L 21/68742 156/707 |
| 2013/0153116 A1* | 6/2013 | Hirakawa | H01L 21/67748 156/64 |
| 2015/0165477 A1* | 6/2015 | Yamazaki | H01L 51/003 427/535 |
| 2015/0279707 A1* | 10/2015 | Sim | H01L 21/68735 156/752 |

* cited by examiner

AUTOMATION LINE FOR PROCESSING A MOLDED PANEL

TECHNICAL FIELD

Various embodiments generally relate to an automation line for processing a molded panel. In particular, various embodiments generally relate to an automation line for releasing a molded panel which is attached, via thermal release adhesive, to a first carrier and sometimes also transferring the molded panel to a second carrier, for example, in a panel level packaging process for a panel based semiconductor assembly. Various embodiments also generally relate to a method of automated processing of a molded panel. In particular, various embodiments generally relate to a method of automated releasing a molded panel which is attached, via thermal release adhesive, to a first carrier, and sometimes also automated transferring the molded panel to a second carrier, for example, in a panel level packaging process for a panel based semiconductor assembly.

BACKGROUND

In a typical panel-level packaging process, electronic elements, such as die, wafer, passive component and metallic component are mounted onto a large carrier and molded into a panel on the large carrier. The molded panel containing electronic elements is then released from the large carrier and flipped in the panel-form to expose the active surface of the electronic elements in order for circuits to be plated on the active surface of the electronic elements.

Conventionally, in a panel release process from a carrier, the molded panel is released by means of heat or ultraviolet (UV) light. These are the two main methods of releasing the molded panel.

In order to utilize the UV light method for releasing the molded panel, glass carrier has to be used. Accordingly, a glass carrier is laminated with a UV release tape. Silicon chips or wafers are then assembled over the UV release tape on the glass carrier. The glass carrier is then molded to form the molded panel on the glass carrier. To release the molded panel, UV light is shined through the back of the glass carrier to release the UV release tape for separating the molded panel from the glass carrier. However, the UV light method is not ideal because glass is expensive, fragile and sensitive to a lot of processes in the panel-level packaging process. Further, usage of glass carrier would limit the size of the carrier as industry players are generally reluctant to adopt usage of large size glass carrier due to its fragile nature. Furthermore, the use of glass carrier also requires some manual delicate handling during the release and transfer process as glass is fragile. For example, during separating of the glass carrier from the molded panel and removing the UV release tap. Such manual process of separation and removal may be prone to electrostatic discharge which contributes to significant failures in panel-level packaging process.

To utilize the heat method for releasing the molded panel, the conventional glass carrier is typically laminated with heat release tape instead of the UV release tape. Electronic elements, such as die, wafer, passive component and metallic component are then assembled over the heat release tape on the glass carrier. The glass carrier is then molded to form the molded panel on the glass carrier. To release the molded panel, heat is applied to the glass to release the heat release tape for separating the molded panel from the glass carrier. However, direct heat exposure to the glass carrier may damage the glass carrier. Heating through the glass carrier may also cause uncontrolled warpage of the molded panel. Further, similar to the UV method, the usage of glass carrier would limit the size of the carrier, and require some manual delicate handling during the release and transfer process as glass is fragile. Furthermore, such manual process of separation and removal may be prone to electrostatic discharge which contributes to significant failures in panel-level packaging process.

Accordingly, there is a need for a more effective apparatus, system and method for performing release and transfer so as to address the above issues.

SUMMARY

According to various embodiments, there is provided an automation line for processing a molded panel. The automation line may include a release workstation capable of receiving an intermediate panel assembly of the molded panel attached to the first carrier, wherein the intermediate panel assembly is in an orientation with the first carrier on a topside. The release workstation may include a release unit including a carrier-engagement arrangement movable to engage the first carrier, the carrier-engagement arrangement having a heating sub-arrangement to thermally contact the first carrier and an attachment sub-arrangement to attach the first carrier to the carrier-engagement arrangement, wherein the carrier-engagement arrangement is operable to heat the intermediate panel assembly to a release temperature of the thermal release adhesive and to separate the first carrier from the molded panel.

According to various embodiments, there is provided a method of automated handling of a molded panel. The method may include heating an intermediate panel assembly of the molded panel attached to the first carrier in an orientation with the first carrier on a topside in a release unit of a release workstation to a release temperature of the thermal release adhesive, wherein a heating sub-arrangement of a carrier-engagement arrangement of the release unit is in thermal contact with the first carrier of the intermediate panel assembly to heat the first carrier. The method may further include separating the first carrier from the molded panel by attaching the first carrier to the carrier-engagement arrangement via an attachment sub-arrangement of the carrier-engagement arrangement and moving the carrier-engagement arrangement away from the molded panel.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DETAILED DESCRIPTION

Figure 1:
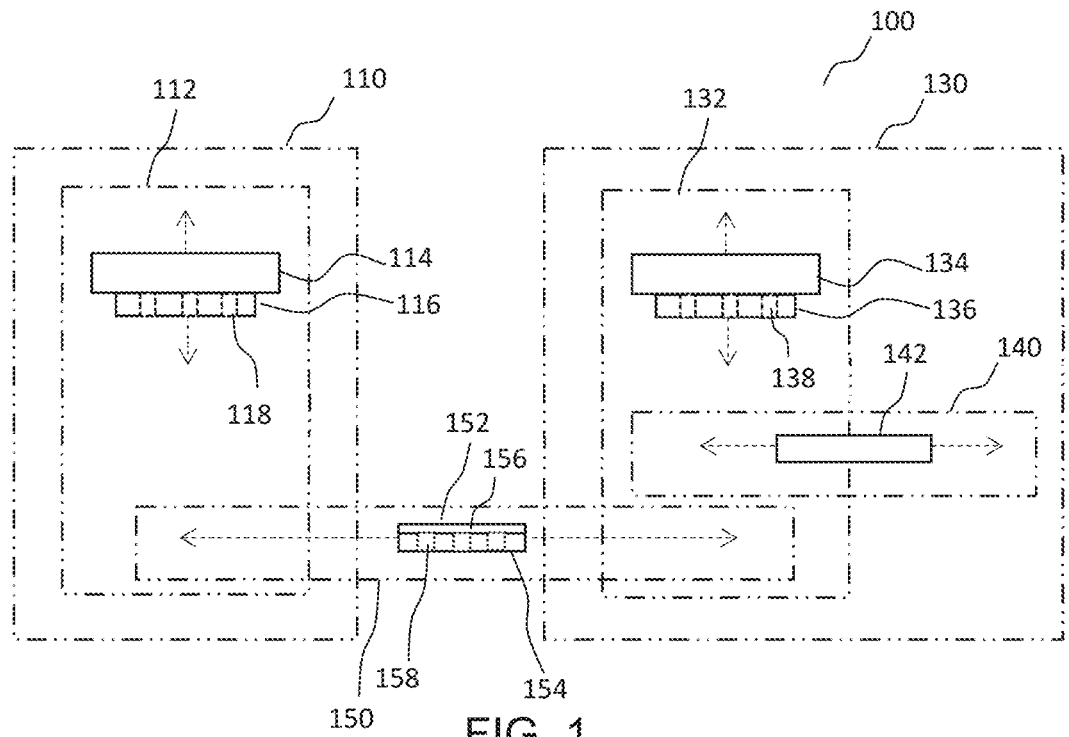
FIG. 1 shows an automation line for processing a molded panel according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments generally relate to an automation line for processing a molded panel. According to various embodiments, processing the molded panel may include releasing the molded panel which is attached, via thermal release adhesive, to a first carrier and sometimes also transferring the molded panel to a second carrier. In particular, various embodiments generally relate to an automation line for releasing the molded panel and sometimes also transferring the molded panel in a panel level packaging process for a panel based semiconductor assembly. According to various embodiments, an automation line may include an automated production line or an automated assembly line or an automated process line or an automated machine including a series of workstations linked by transport or conveying system to perform a pre-defined sequence of steps in a production or manufacturing or assembly or packaging process. According to various embodiments, the automation line may be configured for a pre-defined sequence of steps in a panel level packaging process for a panel based semiconductor assembly. The panel level packaging process is the technology of packaging integrated circuits whereby a plurality of electronic elements, such as die, wafer, passive component and metallic component are packaged simultaneously as a molded panel rather than the conventional technologies of individual electronic elements packaging. Accordingly, a plurality of electronic elements, such as die, wafer, passive component and metallic component, may be molded into a panel form on the first carrier. In order to facilitate subsequent building of layers on the active surface of the individual electronic element, the plurality of electronic elements may be placed flat against the first carrier before the plurality of electronic elements is molded over to form the molded panel. Subsequently, to proceed with building of layers on the active surface of the individual electronic element, the molded panel has to be first released from the first carrier and then transferred to the second carrier with the active surface of the individual electronic element being exposed. The release of the molded panel from the first carrier is defined as the 'release' process herein; meanwhile a combination of release of the molded panel from the first carrier and transferring of the molded panel to the second carrier is defined as the 'release and transfer' process herein. According to various embodiments, there is provided a system or an automation line or a method of releasing a molded panel from a carrier and sometimes also transferring it to another carrier while exposing the active surface of the semiconductor electronic elements in the molded panel. The first carrier and second carrier may be made of any proper material or any combination of proper materials that are suitable for the purpose of the application. According to various embodiments, the first carrier and the second carrier are made of steel or steel alloys. The first carrier and second carrier may be any shape or dimension that is suitable for the purpose of the application. According to various embodiments, both the first carrier and second carrier have a rectangle shape or any shape that is substantially rectangle. According to various embodiments, each of the first carrier and the second carrier may include a carrier panel or a carrier substrate.

Various embodiments seek to provide an automation line or system or method developed to use low cost material, such as low cost steel alloy material, which is much robust and survives all process conditions and handling, together with the use of heat release tape, so as to provide the most economic and efficient solution for large panel manufacturing. Various embodiments seek to gradually heat up the panel assembly to a release temperature. Various embodiments seek to handle the molded panel with precise and controlled motion such that the molded panel may be gently released from the carrier. Various embodiments seek to minimize or ensure no static discharge during the removal of the film. Various embodiments seek to allow transferring the released molded panel to another carrier and expose the active surface of the electronic elements, without physically flipping the molded panel. Various embodiments seek to minimize or ensure no damage to the active surface during the transfer process. Various embodiments seek to ensure the molded panel is not stressed or minimize stress by gradual heating and cooling of the panel assembly.

FIG. 1 shows an automation line 100 for processing a molded panel 202 (see FIG. 2A) according to various embodiments. According to various embodiments, processing the molded panel 202 may include releasing the molded panel, which is attached, via thermal release adhesive, to a first carrier 204 (see FIG. 2A), and transferring the molded panel 202 to a second carrier 206 (see FIG. 2E). Each of the first carrier 204 and the second carrier 206 may include a carrier panel or a carrier substrate. The molded panel 202 may encapsulate a plurality of electronic elements, such as die, wafer, passive component and metallic component, with respective active surfaces flat against the first carrier 204. According to various embodiments, when the molded panel 202 is still attached to the first carrier 204, the molded panel 202 and the first carrier may form an intermediate panel assembly 203. According to various embodiments, the automation line 100 may include a release workstation 110 and a transfer workstation 130. According to various embodiments, the release workstation 110 may be configured to process the intermediate panel assembly 203 such that the molded panel 202 may be separable from the first carrier 204 in order for the molded panel 202 to be released from the first carrier 204. With the molded panel 202 released, the molded panel 202 may be moved to the transfer workstation 130. According to various embodiments, the transfer workstation 130 may be configured to place the molded panel 202 on the second carrier 206 in a manner such that the active surfaces of the plurality of electronic elements contained in the molded panel 202 are exposed or facing upwards and away from the second carrier 206.

According to various embodiments, the release workstation 110 may be capable of receiving the intermediate panel assembly 203 of the molded panel 202 attached to the first carrier 204, wherein the intermediate panel assembly 203 is in an orientation with the first carrier 204 on a topside. Accordingly, the intermediate panel assembly 203 may be delivered or transported into the release workstation 110 with the first carrier 204 on top of the molded panel 202. According to various embodiments, the release workstation 110 may be linked to an earlier workstation which may deliver or transport the intermediate panel assembly 203 via a transporting or conveying system to the release workstation 110 (see for example FIG. 8). According to various embodiment, the release workstation 110 may also be a first workstation of an independent automation line. Accordingly, the intermediate panel assembly 203 may be fed into the release workstation 110 via a feeder system or via manual feeding. Thus, the release workstation 110 may be configured to receive the intermediate panel assembly 203 based on the overall set-up and how automation line 100 fit into the entire production or manufacturing or assembly or packaging process.

According to various embodiments, the release workstation 110 of the automation line 100 may include a release unit 112. According to various embodiments, the release unit 112 may include a carrier-engagement arrangement 114 movable to engage the first carrier 204 of the intermediate panel assembly 203. Accordingly, when the intermediate panel assembly 203 is delivered or transported into the release unit 112 of the release workstation 110, the carrier-engagement arrangement 114 may be operable to move towards the intermediate panel assembly 203 and to engage the first carrier 204 of the intermediate panel assembly 203. According to various embodiments, the release unit 112 may be operated in a manner similar to a press unit and the carrier-engagement arrangement 114 may be movable in a up and down direction (or vertical direction) so as to engage the intermediate panel assembly 203 which is placed underneath the carrier-engagement arrangement 114 when the carrier-engagement arrangement 114 is being moved downwards.

According to various embodiments, the carrier-engagement arrangement 114 may include a heating sub-arrangement 116 to thermally contact the first carrier 204 of the intermediate panel assembly 203. According to various embodiments, the heating sub-arrangement 116 may include a heating plate. Accordingly, the heating sub-arrangement 116 may form a bottom surface of the carrier-engagement arrangement 114 in a manner so as to be capable of being moved into contact with the first carrier 204 of the intermediate panel assembly 203. Hence, heating sub-arrangement 116 may conduct heat to the first carrier 204 of the intermediate panel assembly 203. According to various embodiments, the carrier-engagement arrangement 114 may include an actuator (not shown) to control and move the carrier-engagement arrangement 114 such that the heating sub-arrangement 116 may be moved into contact with the first carrier 204 of the intermediate panel assembly 203. According to various embodiments, the actuator may move the carrier-engagement arrangement 114 based on a movement-control signal. According to various embodiments, the heating sub-arrangement 116 may provide heating based on a heating-control signal.

According to various embodiments, the carrier-engagement arrangement 114 may include an attachment sub-arrangement 118 to attach the first carrier 204 of the intermediate panel assembly 203 to the carrier-engagement arrangement 114. Accordingly, when the first carrier 204 of the intermediate panel assembly 203 is attached to the carrier-engagement arrangement 114 via the attachment sub-arrangement 118, the first carrier 204 of the intermediate panel assembly 203 may be held by or retained on the carrier-engagement arrangement 114. According to various embodiments, the attachment sub-arrangement 118 of the carrier-engagement arrangement 114 may include vacuum suction mechanism such as vacuum holes or vacuum cups, or gripping mechanism such as grippers or clamps, or magnetic mechanism such as electro-magnets. According to various embodiments, the attachment sub-arrangement 118 may be operated based on an attachment-control signal. According to various embodiments, the attachment sub-arrangement 118 of the carrier-engagement arrangement 114 may be configured to hold or retain the first carrier 204 to the carrier-engagement arrangement 114. According to various embodiments, the attachment sub-arrangement 118 of the carrier-engagement arrangement 114 may be in direct interaction with only the first carrier 204 of the intermediate panel assembly 203. Accordingly, when the first carrier 204 and the molded panel 202 are adhered to each other to form the intermediate panel assembly 203, the attachment sub-arrangement 118 of the carrier-engagement arrangement 114 may hole or retain the entire intermediate panel assembly 203 to the carrier-engagement arrangement 114. However, when an adhesive strength of the adhesive between the first carrier 204 and the molded panel 202 is reduced or weaken, the attachment sub-arrangement 118 of the carrier-engagement arrangement 114 which is directly attached to the first carrier 204 may only hold or retain the first carrier 204 to the carrier-engagement arrangement 114. Hence, when the carrier-engagement arrangement 114 is moved in a direction away from the molded panel 202, the carrier-engagement arrangement 114 may move the first carrier 204 in a manner so as to separate the first carrier 204 from the molded panel 202.

According to various embodiments, the carrier-engagement arrangement 114 may be operable to heat the intermediate panel assembly 203 to a predetermined temperature, whereby the adhesive strength of the thermal release adhesive between the first carrier 204 and the molded panel 202 is reduced. Accordingly, the predetermined temperature may be a release temperature of the thermal release adhesive. Subsequently, the carrier-engagement arrangement 114 may be operable to separate the first carrier 204 from the molded panel 202. Accordingly, the carrier-engagement arrangement 114 may be moved to engage the first carrier 204 of the intermediate panel assembly 203 such that the heating sub-arrangement 116 is in thermal contact with the first carrier 204 of the intermediate panel assembly 203 and the attachment sub-arrangement 118 may attach the first carrier 204 of the intermediate panel assembly 203 to the carrier-engagement arrangement 114. The heating sub-arrangement 116 may heat the intermediate panel assembly 203 to the predetermined temperature such that the adhesive strength of the thermal release adhesive is weaken or reduced. The carrier-engagement arrangement 114, which is still holding the first carrier 204, may then be moved away from the molded panel 202 so as to separate the first carrier 204 from the molded panel 202 thereby achieving the release of the molded panel 202.

According to various embodiments, the transfer workstation 130 may be capable of receiving the separated molded panel 202 from the release workstation 110. Accordingly, the separated molded panel 202 may be delivered or transported into the transfer workstation 130. According to various embodiments, the transfer workstation 130 may be linked to the earlier release workstation 110 which may deliver or transport the separated molded panel 202 via a conveying arrangement 150 to the transfer workstation 130. According to various embodiments, the conveying arrangement 150 may include at least one conveying element 152 movable to carry the separated molded panel 202 from the release workstation 110 to the transfer workstation 130. Accordingly, the at least one conveying element 152 may be actuated and moved between the release workstation 110 and the transfer workstation 130. According to various embodiments, the at least one conveying element 152 of the conveying arrangement 150 may include a mobile table, or a conveyor system. According to various embodiments, the at least one conveying element 152 of the conveying arrangement 150 may include a mobile heating table 154 laterally translatable between the release workstation 110 and the transfer workstation 130. According to various embodiments, the at least one conveying element 152 in the form of the mobile heating table 154 may include a heating table-top 156 which is capable of carrying the intermediate panel assembly. According to various embodiments, the mobile heating table 154 may be moved based on a conveying-control signal. According to various embodiments, the heating table-top 156 may provide heating based on a heating-control signal. Accordingly, the intermediate panel assembly 203 may be placed on the heating table-top 156 of the mobile heating table 154. According to various embodiments, the heating table-top 156 may cooperatively heat the intermediate panel assembly 203 together with the heating sub-arrangement 116 of the carrier-engagement arrangement 114 of the release unit 112 when the intermediate panel assembly 203 is sandwiched in between the heating table-top 156 of the mobile heating table and the heating sub-arrangement 116 of the carrier-engagement arrangement 114. According to various embodiments, the mobile heating table 154 may be actuated to move between the release workstation 110 and the transfer workstation 130.

According to various embodiments, the mobile heating table 154 of the at least one conveying element 152 of the conveying arrangement 150 may include an attachment sub-arrangement 158 to attach the molded panel 202 of the intermediate panel assembly 203 to the mobile heating table 154 of the at least one conveying element 152. Accordingly, when the molded panel 202 of the intermediate panel assembly 203 is attached to the mobile heating table 154 of the at least one conveying element 152 via the attachment sub-arrangement 158, the molded panel 202 of the intermediate panel assembly 203 may be held by or retained on the mobile heating table 154 of the at least one conveying element 152. According to various embodiments, the attachment sub-arrangement 158 of the mobile heating table 154 of the at least one conveying element 152 may include vacuum suction mechanism such as vacuum holes or vacuum cups, or gripping mechanism such as grippers or clamps. According to various embodiments, the attachment sub-arrangement 158 may be operated based on an attachment-control signal. According to various embodiments, the attachment sub-arrangement 158 of the mobile heating table 154 of the at least one conveying element 152 may be configured to hold or retain the molded panel 202 to the at least one conveying element 152 in a manner such that moving the carrier-engagement arrangement 114 in a direction away from the mobile heating table 154 of the at least one conveying element 152, wherein the carrier-engagement arrangement 114 is holding the first carrier 204, may move the first carrier 204 in a manner so as to separate the first carrier 204 from the molded panel 202 that is held by the mobile heating table 154 of the at least one conveying element 152 when the adhesive strength of the thermal release adhesive therebetween is weaken or reduced.

According to various embodiments, the transfer workstation 130 of the automation line 100 may include a transfer unit 132. According to various embodiments, the transfer unit 132 may include a molded-panel-engagement arrangement 134 movable to engage the separated molded panel 202. Accordingly, when the separated molded panel 202 is delivered or transported into the transfer unit 132 of the transfer workstation 130, the molded-panel-engagement arrangement 134 may be operable to move towards the separated molded panel 202 and to engage the separated molded panel. According to various embodiments, the transfer unit 132 may be operated in a manner similar to a press unit and the molded-panel-engagement arrangement 134 may be movable in a up and down direction (or vertical direction) so as to engage the separated molded panel 202 which is placed underneath the carrier-engagement arrangement 114 when the molded-panel-engagement arrangement 134 is being moved downwards.

According to various embodiments, the molded-panel-engagement arrangement 134 may include a step-down-heating sub-arrangement 136 to thermally contact the separated molded panel 202. According to various embodiments, the step-down-heating sub-arrangement 136 may include a heating plate. Accordingly, the step-down-heating sub-arrangement 136 may form a bottom surface of the molded-panel-engagement arrangement 134 in a manner so as to be capable of being moved into contact with the separated molded panel 202. Hence, when the step-down-heating sub-arrangement 136 is in contact with the separated molded panel 202, there may be heat transfer between the step-down-heating sub-arrangement 136 and the separated molded panel 202. According to various embodiments, the molded-panel-engagement arrangement 134 may include an actuator (not shown) to control and move the molded-panel-engagement arrangement 134 such that the step-down-heating sub-arrangement 136 may be moved into contact with the separated molded pane 202. According to various embodiments, the actuator may move the molded-panel-engagement arrangement 134 based on a movement-control signal. According to various embodiments, the step-down-heating sub-arrangement 136 may provide heating based on a heating-control signal.

According to various embodiments, the molded-panel-engagement arrangement 134 may include an attachment sub-arrangement 138 to attach the separated molded panel 202 to the molded-panel-engagement arrangement 134. Accordingly, when the separated molded panel 202 is attached to the molded-panel-engagement arrangement 134 via the attachment sub-arrangement 138, the separated molded panel 202 may be held by or retained on the molded-panel-engagement arrangement 134. According to various embodiments, the attachment sub-arrangement 138 of the molded-panel-engagement arrangement 134 may include vacuum suction mechanism such as vacuum holes or vacuum cups, or gripping mechanism such as grippers or clamps. According to various embodiments, the attachment sub-arrangement 138 of the molded-panel-engagement arrangement 134 may be configured to hold or retain the separated molded panel 202 to the molded-panel-engagement arrangement 134. According to various embodiments, the attachment sub-arrangement 138 may be operated based on an attachment-control signal.

According to various embodiments, the molded-panel-engagement arrangement 134 of the transfer unit 132 of the transfer workstation 130 may include an integrated vacuum heating plate having built-in heating elements to serve as the step-down-heating sub-arrangement 136 and a plurality of vacuum holes to serve as the attachment sub-arrangement 138. According to various embodiments, the built-in heating elements may heat up the entire integrated vacuum heating plate. According to various embodiments, the plurality of vacuum holes may attach the molded panel 202 to the integrated vacuum heating plate via vacuum suction.

According to various embodiments, with the separated molded panel 202 attached to the molded-panel-engagement arrangement 134, upward movement and downward movement of the molded-panel-engagement arrangement 134 may lift or lower the separated molded panel. Accordingly, the molded-panel-engagement arrangement 134 may move the separated molded panel 202 so as to lift the separated molded panel 202 for placing the second carrier 206 underneath the separated molded pane 202, and the molded-panel-engagement arrangement 134 may subsequently move the separated molded panel 202 so as to lower the separated molded panel 202 for placing on the second carrier 206.

According to various embodiments, the molded-panel-engagement arrangement 134 may be operable to regulate a temperature of the step-down-heating sub-arrangement 136 between an ambient temperature and the predetermined temperature for heating the intermediate panel assembly 203 in the release unit 112. When the separated molded panel 202 is delivered or transported into the transfer unit 132, the separated molded panel may be at a temperature at or close to the predetermined temperature. However, the temperature of the step-down-heating sub-arrangement 136 of the molded-panel-engagement arrangement 134 controlled or regulated to be higher than the ambient temperature and yet lower than the temperature of the separated molded panel 202. Accordingly, when the step-down-heating sub-arrangement 136 is in thermal contact with the separated molded panel 202, since the separated molded panel 202 is at a higher temperature than the step-down-heating sub-arrangement 136, the separated molded panel 202 may lose heat to the step-down-heating sub-arrangement 136 and thus may start to cool. Since a temperature difference between the step-down-heating sub-arrangement 136 and the separated molded panel 202 is less than a temperature difference between the ambient temperature and the separated molded panel 202, a cooling rate of the separated molded panel 202 in thermal contact with the step-down-heating sub-arrangement 136 may be slower. With a more gradual cooling rate, warping of the separated molded panel 202 may be minimized or eliminated.

According to various embodiments, the transfer workstation 130 of the automation line 100 may include a transporter unit 140. The transporter unit 140 may include a transporter tray 142 movable into and out of the transfer unit 132 of the transfer workstation 130. According to various embodiments, the transporter unit 140 may be movable in a manner so as to carry and position the second carrier 206 underneath the separated molded panel 202 held by the molded-panel-engagement arrangement 134 for placing the separated molded panel 202 on the second carrier 206. According to various embodiments, the transporter tray 142 of the transporter unit 140 may be laterally translatable into and out of the transfer unit 132. According to various embodiments, the transporter tray 142 may be actuated and be moved to position outside the transfer unit 132 so as to receive the second carrier 206 onto the transporter tray 142. The transporter tray 142 may further be actuated and be moved to position within the transfer unit 132 and underneath the molded-panel-engagement arrangement 134 such that the separated molded panel 202 may be placed on the second carrier 206. According to various embodiments, upon completion of the placement of the molded panel 202 on the second carrier 206, the transporter tray 142 may be actuated and be moved to the outside the transfer unit 132 so as to send the assembly of the molded panel 202 and the second carrier 206 out of the transfer unit 132. According to various embodiments, the transporter tray 142 may be moved based on a movement-control signal.

FIG. 2A to FIG. 2F shows schematic diagrams illustrating a method of automated processing of the molded panel 202 according to various embodiments. Automated processing of the molded panel 202 may include automated releasing the molded panel 202 which is attached, via thermal release adhesive, to the first carrier 204, and automated transferring the molded panel 202 to the second carrier 206 based on the automation line 100 of FIG. 1 according to various embodiments.

Figure 2A:
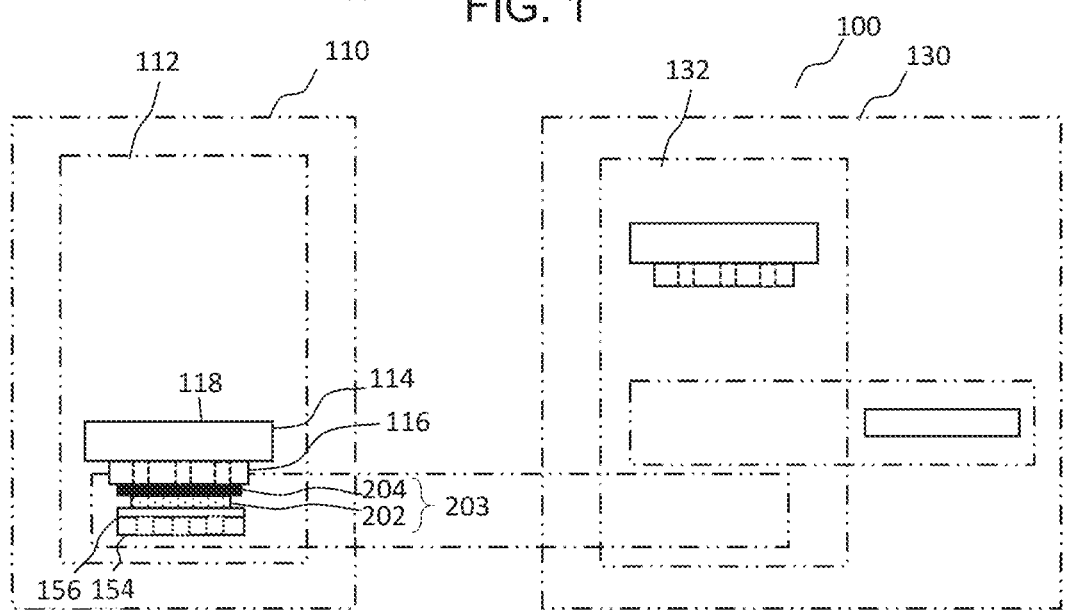
FIG. 2A to FIG. 2F shows schematic diagrams illustrating a method of automated processing the molded panel based on the automation line of FIG. 1 according to various embodiments.

As shown in FIG. 2A, according to various embodiments, the method may include heating the intermediate panel assembly 203 of the molded panel 202 attached to the first carrier 204 in an orientation with the first carrier 204 on a topside in the release unit 112 of the release workstation 110 of the automation line 100 to the predetermined temperature whereby the adhesive strength of the thermal release adhesive between the molded panel 202 and the first carrier 204 is weaken or reduced. According to various embodiments, during heating, the heating sub-arrangement 116 of the carrier-engagement arrangement 114 of the release unit 112 may be in thermal contact with the first carrier 204 of the intermediate panel assembly 203 to heat the first carrier 204. According to various embodiments, during heating, the intermediate panel assembly 203 may be supported on and in thermal contact with the heating table top 156 of the mobile heating table 154, and the heating table-top 156 may cooperatively heat the intermediate panel assembly 203 together with the heating sub-arrangement 116 of the carrier-engagement arrangement 114.

Figure 2B:
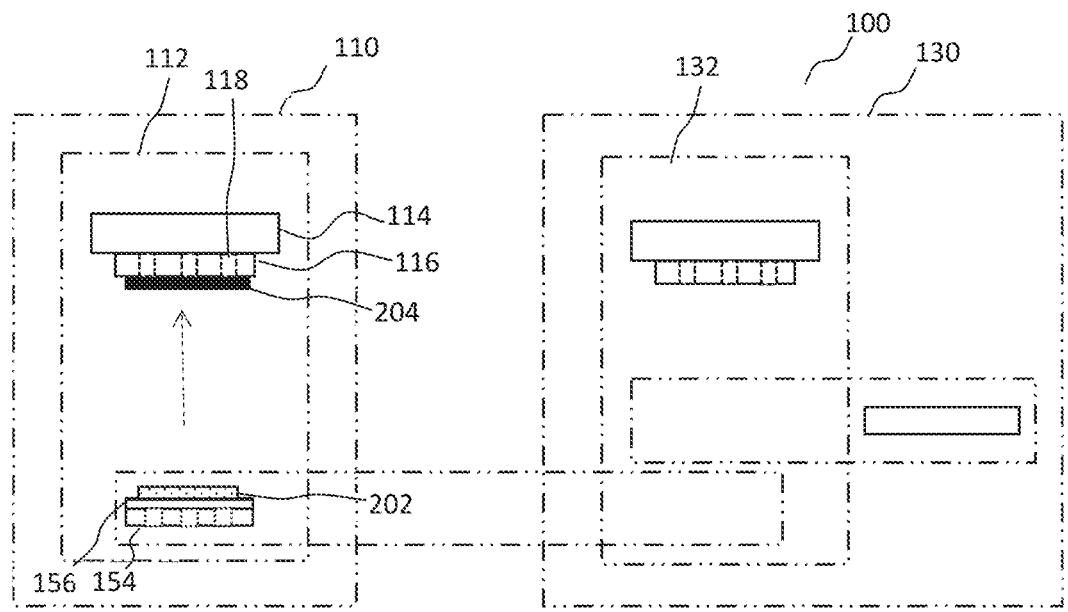

As shown in FIG. 2B, according to various embodiments, the method may include separating the first carrier 204 from the molded panel 202 by attaching the first carrier 204 to the carrier-engagement arrangement 114 via the attachment sub-arrangement 118 of the carrier-engagement arrangement 114 and moving the carrier-engagement arrangement away 114 from the molded panel 202. According to various embodiments, the thermal release adhesive may be configured such that at the predetermined temperature, mere lifting of the first carrier 204 by the carrier-engagement arrangement 114 is sufficient to separate the first carrier 204 from the molded panel. According to various embodiments, the attachment sub-arrangement 158 of the mobile heating table 154 may attach the molded panel 202 to the mobile heating table 154. Accordingly, by attaching the first carrier 204 to the carrier-engagement arrangement 114 and attaching the molded panel 202 to the mobile heating table 154, moving the carrier-engagement arrangement 114 away from the mobile heating table 154 when the adhesive strength of the thermal release adhesive is weaken or reduced may separate the first carrier 204 from the molded panel 202 in a controlled and reliable manner.

Figure 2C:
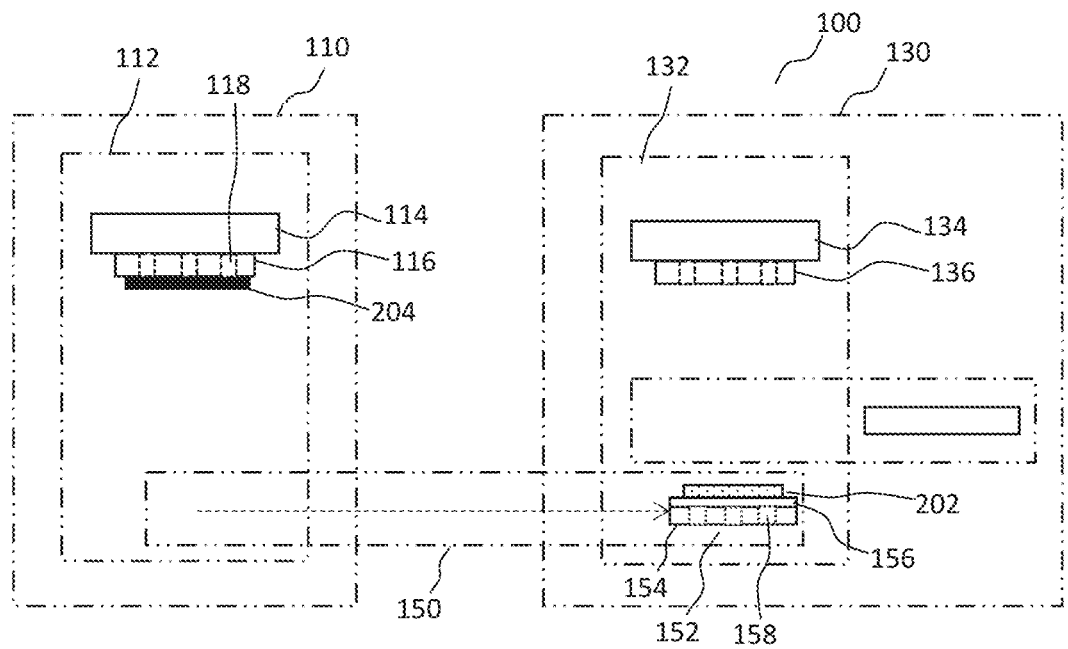

As shown in FIG. 2C, according to various embodiments, the method may include moving the separated molded panel 202 from the release workstation 110 to a transfer workstation 130 via the at least one conveying element 152 of the conveying arrangement 150. According to various embodiments, the at least one conveying element 152 is the mobile heating table 154. According to various embodiments, during movement of the mobile heating table 154, the separated molded panel 202 may remain attached to the mobile heating table 154 via the attachment sub-arrangement 158 of the mobile heating table 154. According to various embodiments, during movement of the mobile heating table 154, the separated molded panel 202 may also remain in thermal contact with the heating table top 156 of the mobile heating table 154 such that the heating table top 156 may continue to heat or maintain the temperature of the separated molded panel 202 close to or at the predetermined temperature.

Figure 2D:
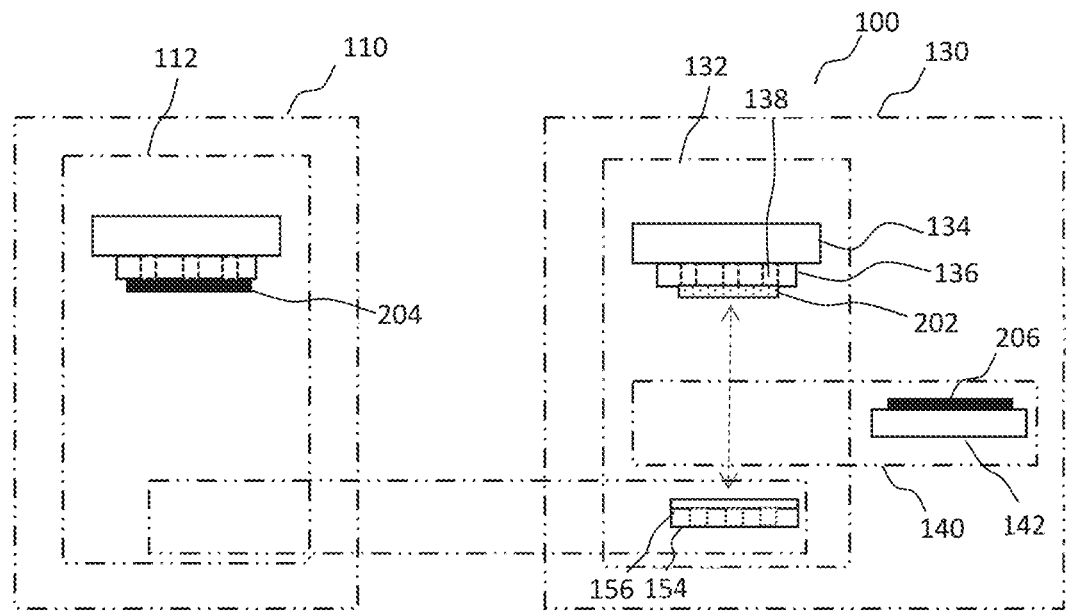

As shown in FIG. 2D, according to various embodiments, the method may include lifting the separated molded panel 202 in the transfer unit 132 of the transfer workstation 130 by attaching the separated molded panel 202 to the molded-panel-engagement arrangement 134 via the attachment sub-arrangement 138 of the molded-panel-engagement arrangement 134, which is regulated at a temperature between an ambient temperature and the predetermined temperature, and moving the molded-panel-engagement arrangement 134 away from the at least one conveying element 152 of the conveying arrangement 150. Accordingly, the attachment sub-arrangement 138 may hold the separated molded panel 202 such that moving the molded-panel-engagement arrangement may move the separated molded panel 202, and the step-down-heating sub-arrangement 136 may provide a step-down-heated environment for gradual cooling of the separated molded panel 202.

Figure 2E:
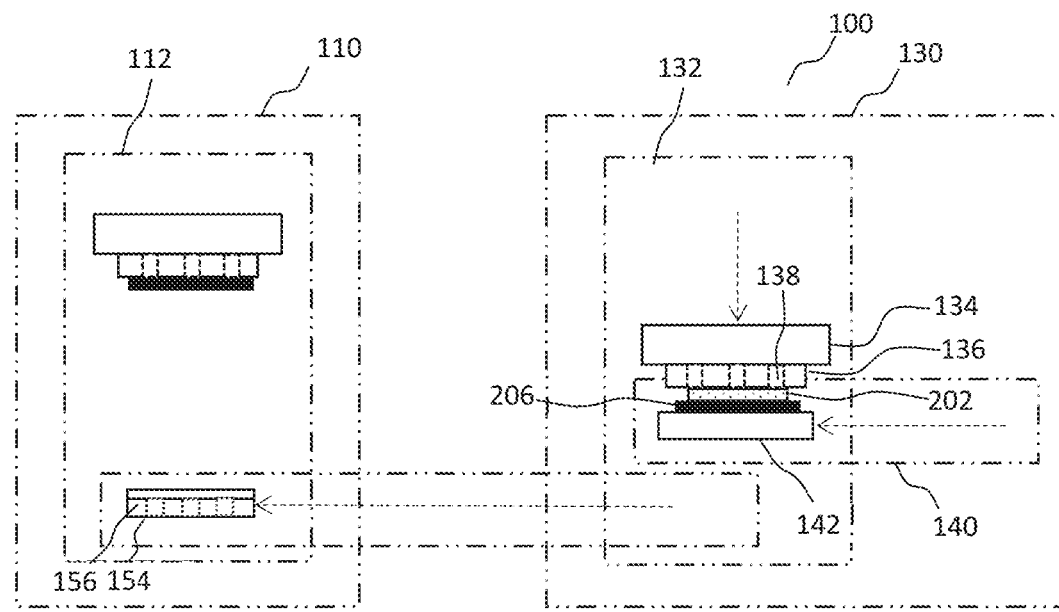

As shown in FIG. 2E, according to various embodiments, the method may include moving the second carrier 206 to position underneath the separated molded panel 202 held by the molded-panel-engagement arrangement 134 via the transporter tray 142 of the transporter unit 140 of the transfer workstation 130. According to various embodiments, the second carrier 206 may be placed on the transporter tray 142. Accordingly, after the separated molded panel 202 has been lifted as shown in FIG. 2D, the transporter tray 142 may move the second carrier 206 to position for placement of the separated molded panel 202. As also shown in FIG. 2E, according to various embodiments, the method may include placing the separated molded panel 202 on the second carrier 206 by moving the molded-panel-engagement arrangement 134 towards the transporter tray 142. According to various embodiments, the movement of the molded-panel-engagement arrangement 134 and the transporter tray 142 may be sequentially or may be simultaneously in a coordinated manner.

Figure 2F:
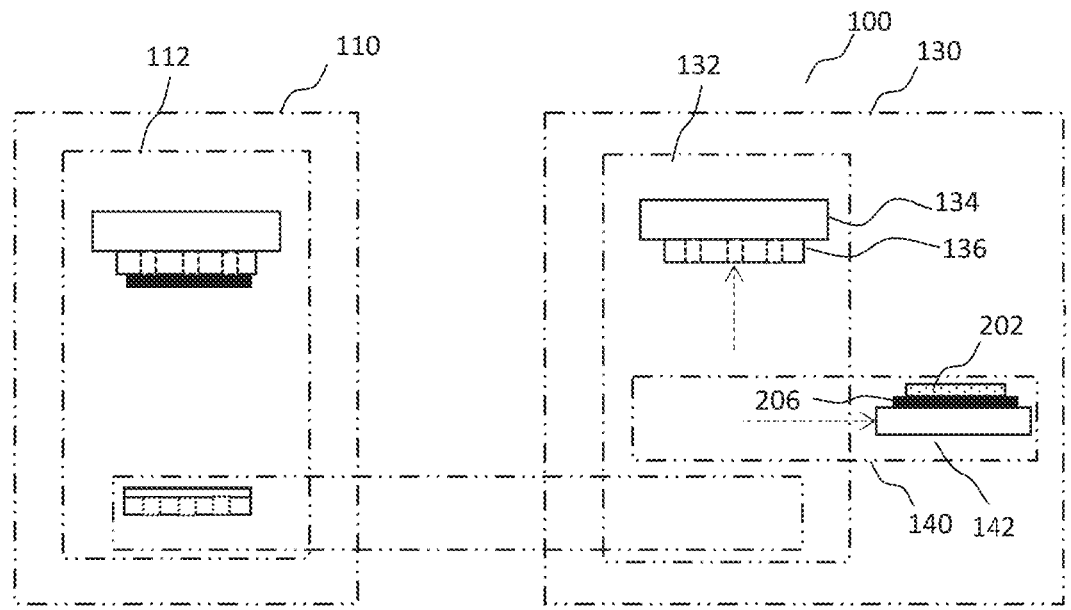

As shown in FIG. 2F, according to various embodiments, the method may include moving the assembly of the molded panel 202 on the second carrier 206 out of the transfer unit 132 via the transporter tray 142.

Figure 3A:
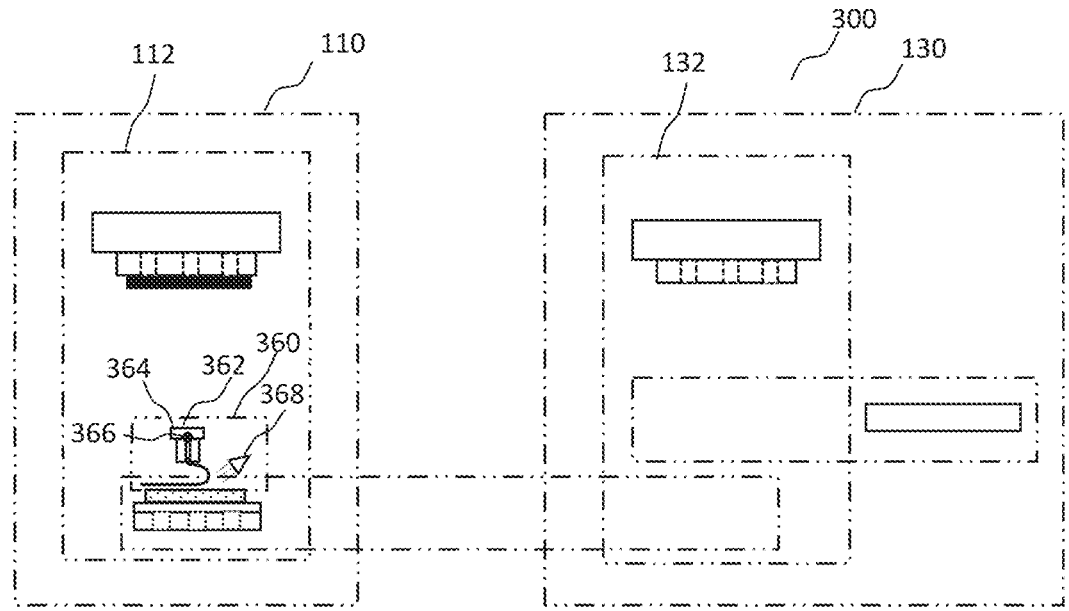
FIG. 3A shows an automation line for processing a molded panel according to various embodiments.

FIG. 3A shows an automation line 300 for processing the molded panel 202 (see FIG. 2A) according to various embodiments. According to various embodiments, processing the molded panel 202 may include releasing the molded panel 202, which is attached, via thermal release adhesive, to a first carrier 204 (see FIG. 2A), and transferring the molded panel 202 to a second carrier 206 (see FIG. 2E). According to various embodiments, the automation line 300 of FIG. 3A differs from the automation line 100 of FIG. 1 in that the automation line 300 of FIG. 3A may further include the following.

According to various embodiments, the release workstation 110 of the automation line 300 of FIG. 3A may further include an adhesive removal unit 360. The adhesive removal unit may include an adhesive removal tool 362 to engage and remove the thermal release adhesive from the molded panel 202. According to various embodiments, the adhesive removal tool 362 may be movable from a first edge portion of the molded panel 202 to an opposite second edge portion of the molded panel 202 so as to remove the thermal release adhesive across the molded panel 202 in a manner from the first edge portion to the second edge portion. According to various embodiments, the adhesive removal unit 360 may be moved based on a movement-control signal.

As shown, according to various embodiments, the thermal release adhesive between the molded panel 202 and the first carrier 204 may include a thermal release adhesive sheet 305. According to various embodiments, the adhesive removal tool 362 may include an attachment mechanism 364 to hold an edge portion of the thermal release adhesive sheet 305 of the thermal release adhesive. According to various embodiments, the attachment mechanism 364 may include a clamping mechanism or a vacuum mechanism. According to various embodiments, the attachment mechanism 364 may be operated based on a corresponding control signal. According to various embodiments, the thermal release adhesive sheet 305 may include, but not limited to, a thermal release adhesive film, a thermal release adhesive tape, or a thermal release adhesive membrane. According to various embodiments, the adhesive removal tool 362 may be actuated and moved in a manner so as to remove the thermal release adhesive sheet 305 entirely from the molded panel 202. For example, the adhesive removal tool 362 may be configured to move from the first edge portion of the molded panel 202 to the second edge portion of the molded panel 202. According to various embodiments, the adhesive removal tool 362 may be configurable to move in any predetermined direction and/or sequence in order to remove the thermal release adhesive sheet 305 entirely from the molded panel 202. According to various embodiments, when the attachment mechanism 364 includes the clamping mechanism, the clamping mechanism may include clamping members 364a, 364b including, but not limited to, grippers or clamps or fingers or jaws. According to various embodiments, the clamping mechanism may be actuated to clamp or grasp the edge portion of the thermal release adhesive sheet 305. According to various embodiments, when the attachment mechanism 364 includes the vacuum mechanism, the vacuum mechanism may be operated to suck the edge portion of the thermal release adhesive sheet 305.

According to various embodiments, the adhesive removal unit 360 may include an adhesive detector 366 to sense a presence of the edge portion of the thermal release adhesive sheet 305 held within the adhesive removal tool 362. According to various embodiments, the adhesive detector 366 may include a sensor configured to sense the presence of the thermal release adhesive sheet 305 clamped in between the clamping mechanism 364 of the adhesive removal tool 362. According to various embodiments, the sensor may include any suitable type of sensor, for example contact sensor, proximity sensor, touch sensor, light sensor, etc. According to various embodiments, the adhesive detector 366 may provide a detection signal indicating whether the thermal release adhesive sheet 305 is held by the adhesive removal tool 362. According to various embodiments, when the adhesive detector 366 sense that the edge portion of the thermal release adhesive sheet 305 is no longer held within the adhesive removal tool 362 during the peeling process, the adhesive detector 366 may be configured to trigger an alarm to alert the operators.

As shown, the release workstation 110 of the automation line 300 of FIG. 3A may further include a static neutralizer 368. According to various embodiments, the static neutralizer 368 may be associated with the adhesive removal tool 362 to discharge ions at an interface 307 of the molded panel 202 and the thermal release adhesive sheet 305 as the adhesive removal tool 362 moves across the molded panel 202 to peel the thermal release adhesive sheet 305. According to various embodiments, the static neutralizer 368 may be movable together with the adhesive removal tool 362 in a synchronized manner. According to various embodiments, the static neutralizer 368 may include an air ionizer configured to discharge a stream of ionized air. Accordingly, the static neutralizer 368 in the form of the air ionizer may be disposed relative to the adhesive removal tool 362 such that the stream of ionized air discharged may be directed to the interface 307 between the molded panel 202 and the thermal release adhesive sheet 305 when the thermal release adhesive sheet 305 is being removed. According to various embodiments, the static neutralizer 368 may be operated based on a discharge-control signal.

Figure 4A:
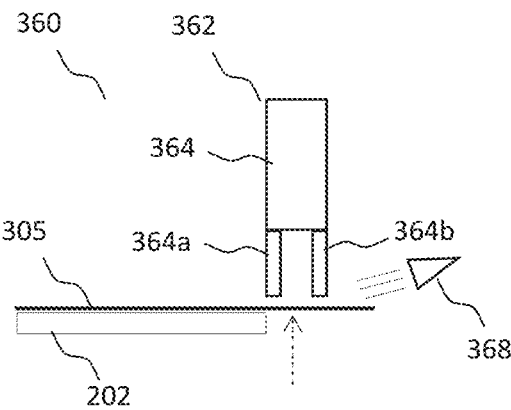
FIG. 4A to FIG. 4D shows schematic diagrams illustrating a method of removing the thermal release adhesive sheet from the molded panel using the adhesive removal tool of the automation line of FIG. 3A according to various embodiments.

FIG. 4A to FIG. 4D shows schematic diagrams illustrating a method of removing the thermal release adhesive sheet 305 from the molded panel 202 using the adhesive removal tool 362 according to various embodiments. As shown in FIG. 4A, according to various embodiments, the method may include pushing the edge portion of the thermal release adhesive sheet 305 in between the clamping members 364a, 364b of the clamping mechanism 364. According to various embodiments, the adhesive removal unit 360 may include a mechanical pusher 363 to push the edge portion of the thermal release adhesive sheet 305 into a space between the clamping members 364a, 364b. The mechanical pusher may include, but not limited to, a plunger or a pushing rod or a pushing bar. According to various embodiments, the mechanical pusher may be operated based on a pusher-control signal.

Figure 4B:
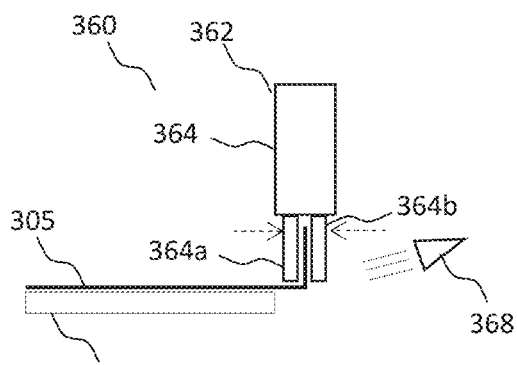

As shown in FIG. 4B, according to various embodiments, the method may include clamping the edge portion of the thermal release adhesive sheet 305 with the clamping members 364a, 364b of the clamping mechanism 364. According to various embodiments, upon detection of the edge portion of the thermal release adhesive sheet 305 being pushed into the clamping mechanism 364 by the adhesive detector 366, the clamping members 364a, 364b of the clamping mechanism 364 may be moved towards each other to sandwich the edge portion of the thermal release adhesive sheet 305 therebetween so as to clamp and hold the edge portion of the thermal release adhesive sheet 305.

Figure 4C:
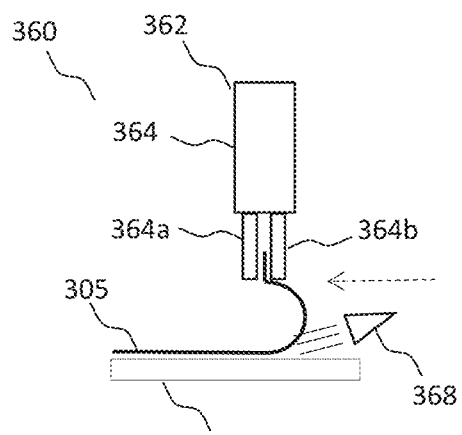

As shown in FIG. 4C, according to various embodiments, the method may include moving the adhesive removal tool 362 laterally across the molded panel 202 to peel and remove the thermal release adhesive sheet 305. According to various embodiments, the static neutralizer 368 may be activated and may be moved along with the movement of the adhesive removal tool 362 in a synchronized manner so as to neutralize the static built up during peeling of the thermal release adhesive sheet 305 from the molded panel 202.

Figure 4D:
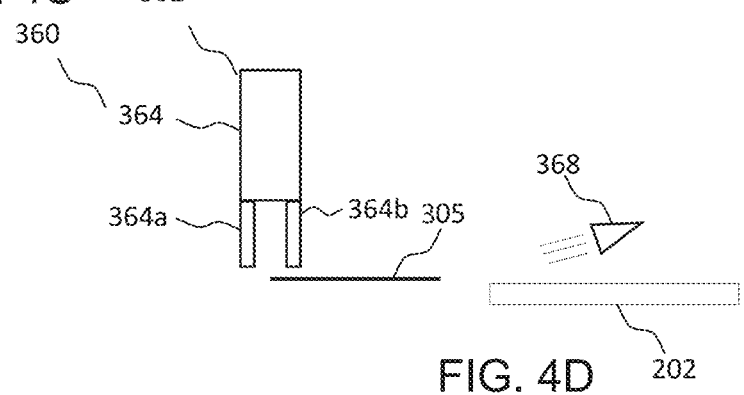

As shown in FIG. 4D, according to various embodiments, the method may include moving the adhesive removal tool 362 with the peeled thermal release adhesive sheet 305 to a disposal area and opening the clamping members 364a, 364b of the clamping mechanism 364 to drop and dispose the peeled thermal release adhesive sheet 305 in the disposal area.

Figure 3B:
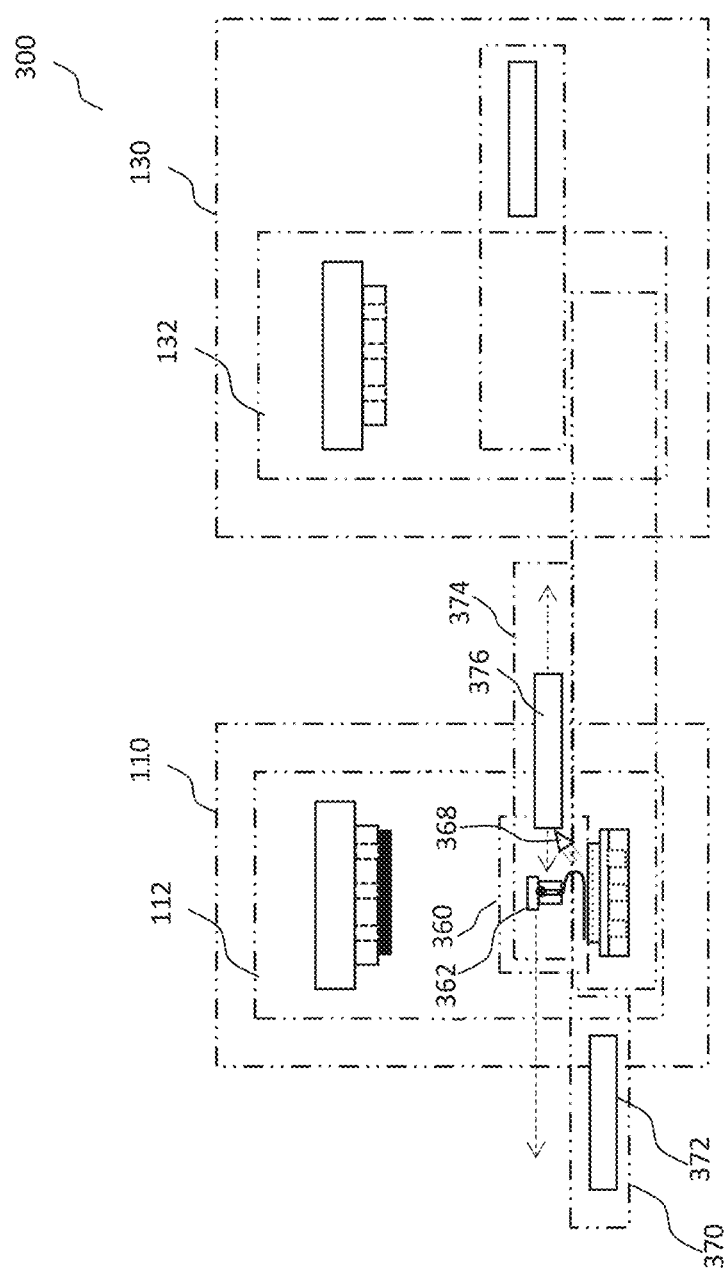
FIG. 3B shows a schematic diagram with further details of the automation line of FIG. 3A according to various embodiments.

FIG. 3B shows a schematic diagram with further details of the automation line 300 of FIG. 3A according to various embodiments. As shown in FIG. 3B, according to various embodiments, the release workstation 110 of the automation line 300 may further include an adhesive disposal unit 370. The adhesive disposal unit 370 may be configured for disposal of the peeled thermal release adhesive sheet 305. According to various embodiments, the adhesive disposal unit 370 may include a stationary collection tray 372 located within reach of the actuated adhesive removal tool 362 such that the adhesive removal tool 362 may bring the peeled thermal release adhesive sheet 305 to the adhesive disposal unit 370 and drop the peeled thermal release adhesive sheet 305 onto the stationary collection tray 372 for disposal.

As also shown in FIG. 3B, according to various embodiments, the release workstation 110 of the automation line 300 may further include a carrier removal unit 374. The carrier removal unit 374 may be configured to remove the first carrier 204 from the release unit 112 of the release workstation 110. According to various embodiments, the carrier removal unit 374 may include a carrier receiving tray 376 movable into and out of the release unit 112 of the release workstation 110. The carrier receiving tray 376 may be actuated and moved underneath the first carrier 204 held by the carrier-engagement arrangement 114 of the release unit 112. The carrier-engagement arrangement 114 may then be operated to release and place the first carrier 204 onto the carrier receiving tray 376. Subsequently, the carrier receiving tray 376 may be actuated to move out of the release unit 112 while carrying the first carrier 204. According to various embodiments, the first carrier 204 may then be removed from the carrier receiving tray 376 for storage or reuse. According to various embodiments, the carrier receiving tray 376 may be moved based on a movement-control signal. According to various embodiments, while not being shown in the drawings, the carrier receiving tray 376 of the carrier removal unit 374 may be movable along a movement plane parallel to that of the mobile heating table 154 of the conveying arrangement 150 translating between the release workstation 110 and the transfer workstation 130. According to various embodiments, while not being shown in the drawings, a removal-movement-direction of the carrier receiving tray 376 of the carrier removal unit 374 may be perpendicular to a translating-movement-direction of the mobile heating table 154 of the conveying arrangement 150.

According to various embodiments, the static neutralizer 368 (serving as a static discharge unit) may be mounted to the carrier receiving tray 376 of the carrier removal unit 374. According to various embodiments, the static neutralizer 368 may be mounted at an edge of the carrier receiving tray 376. According to various embodiments, when the adhesive removal tool 362 is moving to peel and remove the thermal release adhesive sheet 305, the carrier receiving tray 376 of the carrier removal unit 374 may be moved in a synchronized manner with the adhesive removal tool 362 in a same direction (or along a same movement axis) in a manner such that the static neutralizer 368 on the carrier receiving tray 376 is moved in an optimal manner to concentrate the ionized effect at the interface of the thermal release adhesive sheet 305 and the molded panel 202. According to various embodiments, as the carrier receiving tray 376 is moving in a synchronous manner with the adhesive removal tool 362, the carrier receiving tray 376 may be moving so as to be positioned under the first carrier 204 held by the carrier-engagement arrangement 114 of the release unit 112. Accordingly, when the peeling process is completed by the adhesive removal tool 362, the carrier receiving tray 376 may be in a pre-determined position under the first carrier 204 such that the carrier-engagement arrangement 114 may then be operated to release and place the first carrier 204 onto the carrier receiving tray 376. Subsequently, the carrier receiving tray 376 may be actuated to move out of the release unit 112 while carrying the first carrier 204.

Figure 5:
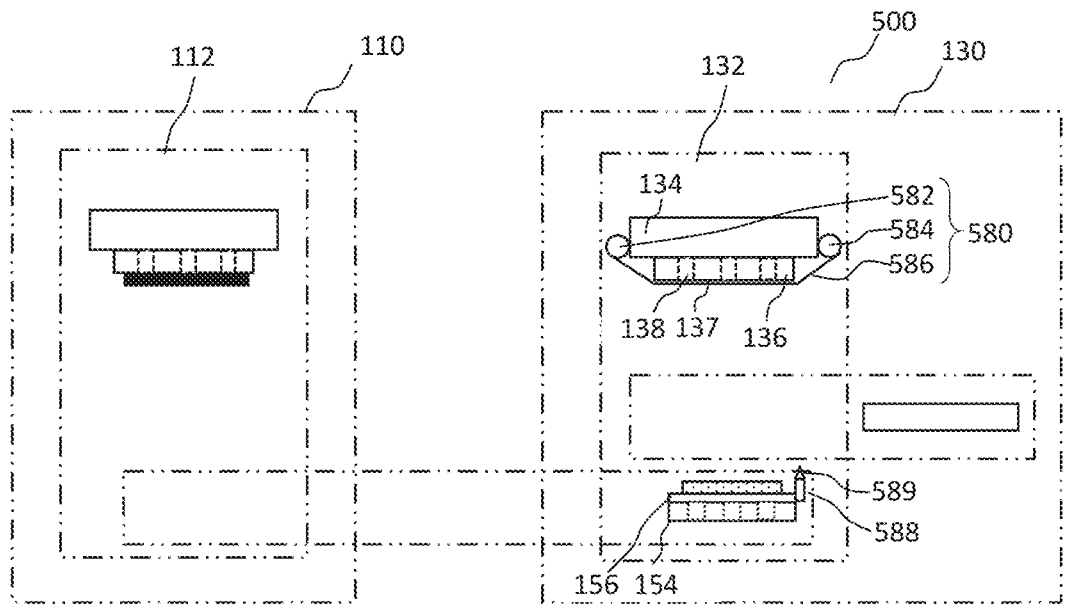
FIG. 5 shows an automation line for processing a molded panel according to various embodiments.

FIG. 5 shows an automation line 500 for processing the molded panel 202 according to various embodiments. According to various embodiments, processing the molded panel 202 may include releasing the molded panel 202 which is attached, via thermal release adhesive, to a first carrier 204, and transferring the molded panel 202 to a second carrier 206 according to various embodiments. According to various embodiments, the automation line 500 of FIG. 5 differs from the automation line 100 of FIG. 1 in that the automation line 500 of FIG. 5 may further include the following.

According to various embodiments, the transfer workstation 130 of the automation line 500 of FIG. 5 may further include a protective film dispenser unit 580. The protective film dispenser unit 580 may include a protective film supply reel 582 coupled to a first side of the molded-panel-engagement arrangement 134 of the transfer unit 132 and a protective film take-up reel 584 coupled to an opposite second side of the molded-panel-engagement arrangement 134 of the transfer unit 132. Accordingly, the protective film supply reel 582 and the protective film take-up reel 584 may be on two opposite sides of the molded-panel-engagement arrangement 134 of the transfer unit 132. According to various embodiments, a protective film 586 may be suspended between the protective film supply reel 582 and the protective film take-up reel 584 across a thermal contact surface 137 of the step-down-heating sub-arrangement 136 of the molded-panel-engagement arrangement 134 of the transfer unit 132. According to various embodiments, the protective film take-up reel 584 may be actuated such that a used segment of the protective film 586 may be reeled onto the protective film take-up reel 584 and a fresh segment of the protective film 586 may be unreeled from the protective film supply reel 582. According to various embodiments, the protective film take-up reel 584 may be operated based on a reel-control signal. According to various embodiments, the protective film 586 may provide protection for the active surface of the electronic elements in the molded panel 202. According to various embodiments, the attachment sub-arrangement 138 of the molded-panel-engagement arrangement 134 of the transfer unit 132 may be configured to apply a vacuum to attach, via suction, the protective film 586 onto the thermal contact surface 137 of the step-down-heating sub-arrangement 136 of the molded-panel-engagement arrangement 134 of the transfer unit 132. According to various embodiments, the protective film 586 may include a plurality of holes. According to various embodiments, the plurality of holes of the protective film 586 may be aligned to some of the vacuum holes or vacuum cups of the attachment sub-arrangement 138 of the molded-panel-engagement arrangement 134 of the transfer unit 132 such that these vacuum holes or vacuum cups may serve to attach the molded panel 202 to the step-down-heating sub-arrangement 136 of the molded-panel-engagement arrangement 134 of the transfer unit 132.

According to various embodiments, the mobile heating table 154 of the conveying arrangement 150 may further include a protective film puncturing arrangement 588. The protective film puncturing arrangement 588 may be configured to make the plurality of holes in the protective film 586. According to various embodiments, the protective film puncturing arrangement 588 may be adjacent to a side of the heating table-top 156 of the mobile heating table 154 of the conveying arrangement 150. According to various embodiments, the protective film puncturing arrangement 588 may include a plurality of puncturing prods 589. According to various embodiments, the mobile heating table 154 may be actuated and moved to a pre-determined position relative to the molded-panel-engagement arrangement 134 of the transfer unit 132. The molded-panel-engagement arrangement 134 of the transfer unit 132 may then be actuated and moved towards the mobile heating table 154 such that the plurality of puncturing prods 589 of the mobile heating table 154 may engage the protective film 586 suspended on the molded-panel-engagement arrangement 134 so as to puncture and create the plurality of holes in the protective film 586.

Figure 6:
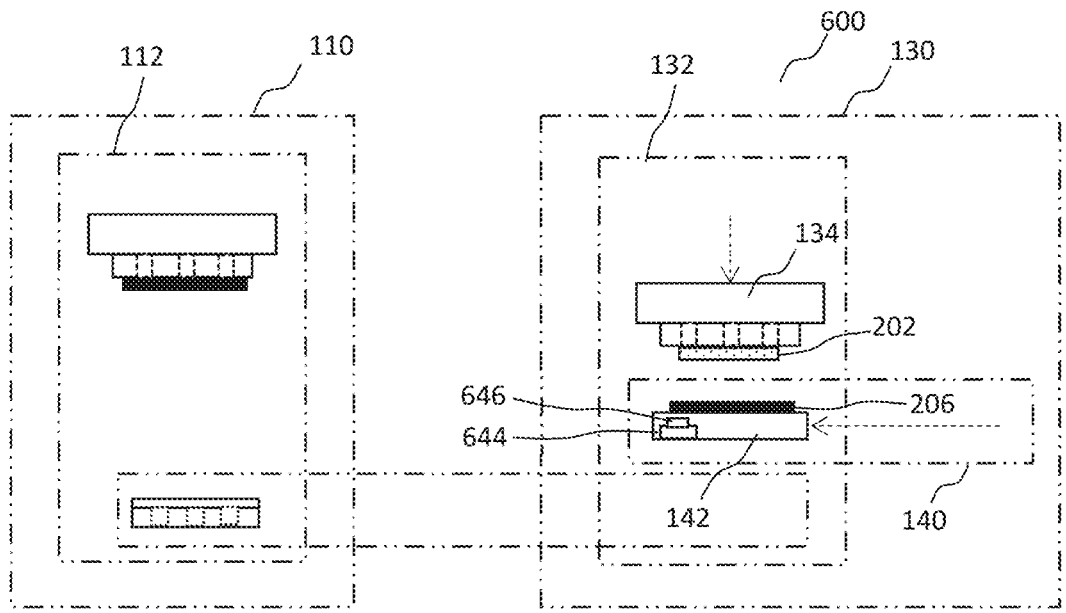
FIG. 6 shows an automation line for processing a molded panel according to various embodiments.

FIG. 6 shows an automation line 600 for processing the molded panel 202 according to various embodiments. According to various embodiments, processing the molded panel 202 may include releasing the molded panel 202 which is attached, via thermal release adhesive, to a first carrier 204, and transferring the molded panel 202 to a second carrier 206 according to various embodiments. According to various embodiments, the automation line 600 of FIG. 6 differs from the automation line 100 of FIG. 1 in that the automation line 600 of FIG. 6 may further include the following.

According to various embodiments, the transfer workstation 130 of the automation line 600 of FIG. 6 may further include an alignment guidance arrangement 644 to guide relative movement between the molded-panel-engagement arrangement 134 of the transfer unit 132 and the transporter tray 142 of the transporter unit 140 carrying the second carrier 206 for aligning the separated molded panel 202 and the second carrier 206 during placement of the separated molded panel 202 on the second carrier 206. According to various embodiments, the alignment guidance arrangement 644 may measure and determine a relative position off-set between the separated molded panel 202 and the second carrier 206 so as to actuate the molded-panel-engagement arrangement 134 of the transfer unit 132 and the transporter tray 142 of the transporter unit 140 accordingly to align the separated molded panel 202 and the second carrier 206 for placement. According to various embodiments, the alignment guidance arrangement 644 may provide a detection signal indicating a relative position off-set between the separated molded panel 202 and the second carrier 206. According to various embodiments, the alignment guidance arrangement 644 may include a vision alignment guidance arrangement including an image capturing device 646.

According to various embodiments, the image capturing device 646 may be coupled to the transporter tray 142 to provide visual feedback of relative offset in position between the separated molded panel 202 and the second carrier 206 for controlling relative movement of the transporter tray 142 and the molded-panel-engagement arrangement 134 to align the separated molded panel 202 and the second carrier 206.

Figure 7:
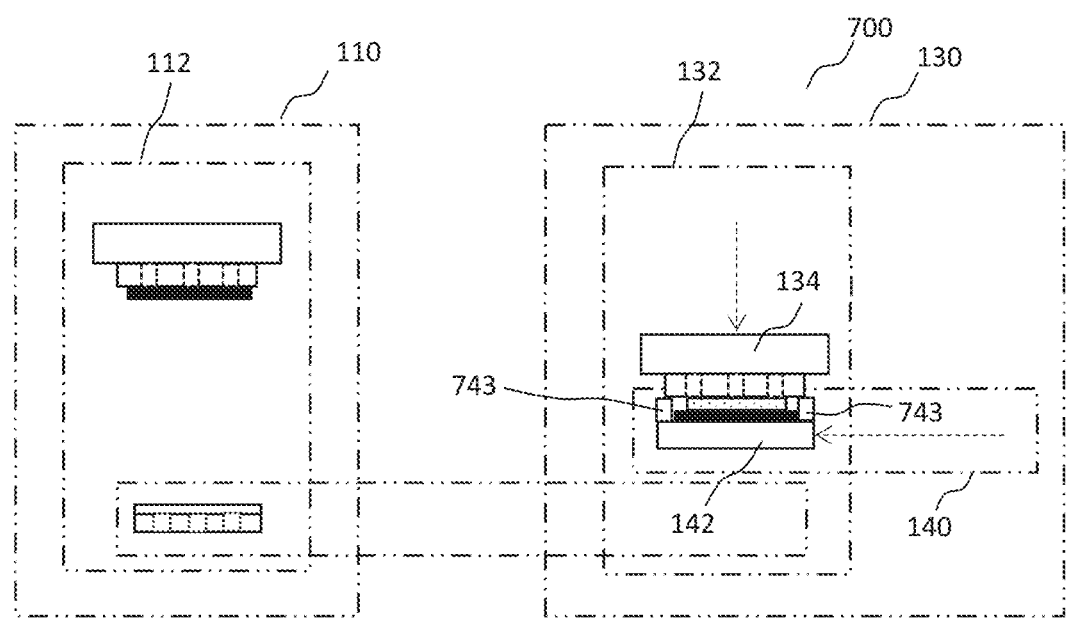
FIG. 7 shows an automation line for processing a molded panel according to various embodiments.

FIG. 7 shows an automation line 700 for processing the molded panel 202 according to various embodiments. According to various embodiments, processing the molded panel 202 may include releasing the molded panel 202 which is attached, via thermal release adhesive, to a first carrier 204, and transferring the molded panel 202 to a second carrier 206 according to various embodiments. According to various embodiments, the automation line 700 of FIG. 7 differs from the automation line 100 of FIG. 1 in that the automation line 700 of FIG. 7 may further include the following.

According to various embodiments, when the molded-panel-engagement arrangement 134 of the transfer unit 132 is lowered and in engagement with the transporter tray 142 of the transporter unit 140, the molded-panel-engagement arrangement 134 and the transporter tray 142 may cooperatively form a sealed enclosure in a manner such that the sealed enclosure is capable of creating a vacuum environment for void-free placement of the separated molded panel 202 to the second carrier 206. According to various embodiments, placing of the molded panel 202 on the second carrier 206 under vacuum environment may ensures that the molded panel 202 is placed perfectly flat against the second carrier 206 without any air gaps therebetween.

According to various embodiments, the transporter tray 142 may include a seal 743 around a periphery portion of the transporter tray 142. According to various embodiments, the seal 743 may be a rubber seal or gasket which surrounds the periphery portion of the transporter tray 142. Accordingly, the seal 743 may form a continuous endless loop to encircle the periphery portion of the transporter tray 142. According to various embodiments, the transporter tray 142 may include a vacuum generation mechanism to create the vacuum in the sealed enclosure formed by the molded-panel-engagement arrangement 134 and the transporter tray 142. According to various embodiments, the vacuum generation mechanism may be operated based on a vacuum-generation-control signal.

Figure 8:
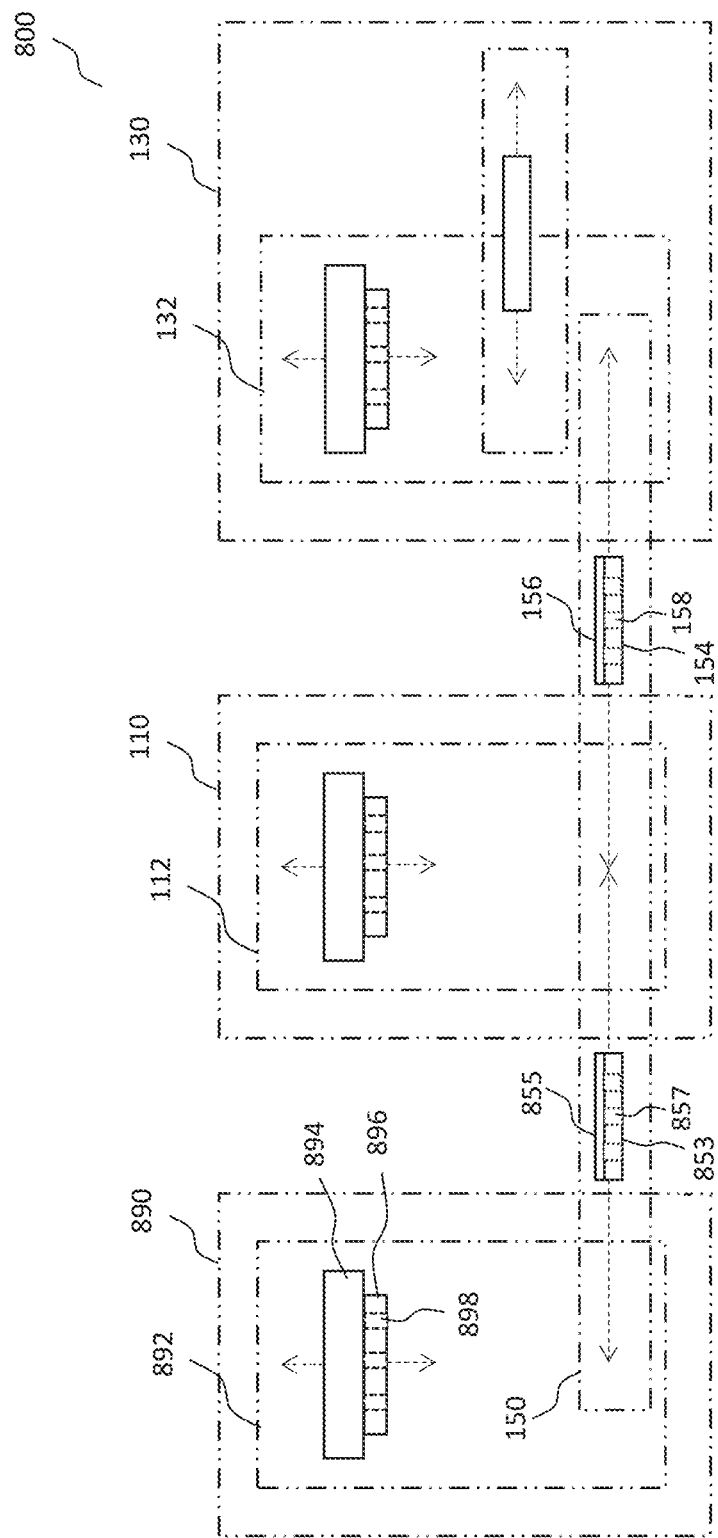
FIG. 8 shows an automation line for processing a molded panel according to various embodiments.

FIG. 8 shows an automation line 800 for processing the molded panel 202. According to various embodiments, processing the molded panel 202 may include releasing the molded panel 202 which is attached, via thermal release adhesive, to a first carrier 204, and transferring the molded panel 202 to a second carrier 206 according to various embodiments. According to various embodiments, the automation line 800 of FIG. 8 differs from the automation line 100 of FIG. 1 in that the automation line 800 of FIG. 8 may further include the following.

According to various embodiments, the automation line 800 of FIG. 8 may further include a pre-heating workstation 890 capable of receiving the intermediate panel assembly 203 in the orientation with the first carrier 204 on a topside. According to various embodiments, the pre-heating workstation 890 may be configured to pre-heat the intermediate panel assembly 203 received in the pre-heating workstation 890 to an intermediate temperature below the predetermined temperature in the release workstation 110. According to various embodiments, the intermediate panel assembly 203 may be delivered or transported into the pre-heating workstation 890 with the first carrier 204 on top of the molded panel 202. According to various embodiments, the pre-heating workstation 890 may be linked to an earlier workstation which may deliver or transport the intermediate panel assembly 203 via a transporting or conveying system to the pre-heating workstation 890. According to various embodiments, the pre-heating workstation 890 may also be a first workstation of an independent automation line. Accordingly, the intermediate panel assembly 203 may be fed into the pre-heating workstation 890 via a feeder system (for example, see FIG. 10) or via manual feeding. Thus, the pre-heating workstation 890 may be configured to receive the intermediate panel assembly 203 based on the overall set-up and how automation line 800 fit into the entire production or manufacturing or assembly or packaging process.

According to various embodiments, the pre-heating workstation 890 of the automation line 800 may include a pre-heating unit 892. According to various embodiments, the pre-heating unit 892 may include a panel-assembly-engagement arrangement 894 movable to engage the intermediate panel assembly 203. Accordingly, when the intermediate panel assembly 203 is delivered or transported into the pre-heating unit 892 of the pre-heating workstation 890, the panel-assembly-engagement arrangement 894 may be operable to move towards the intermediate panel assembly 203 and to engage the intermediate panel assembly 203. According to various embodiments, the pre-heating unit 892 may be operated in a manner similar to a press unit and the panel-assembly-engagement arrangement 894 may be movable in a up and down direction (or vertical direction) so as to engage the intermediate panel assembly 203 which is placed underneath the panel-assembly-engagement arrangement 894 when the panel-assembly-engagement arrangement 894 is being moved downwards.

According to various embodiments, the panel-assembly-engagement arrangement 894 may include a pre-heating sub-arrangement 896 to thermally contact the intermediate panel assembly 203. According to various embodiments, the pre-heating sub-arrangement 896 may include a heating plate. Accordingly, the pre-heating sub-arrangement 896 may form a bottom surface of the panel-assembly-engagement arrangement 894 in a manner so as to be capable of being moved into contact with the intermediate panel assembly 203. According to various embodiments, the pre-heating sub-arrangement 896 may thermally contact the first carrier 204 of the intermediate panel assembly 203. Hence, the pre-heating sub-arrangement 896 may conduct heat to the first carrier 204 of the intermediate panel assembly 203. According to various embodiments, the panel-assembly-engagement arrangement 894 may include an actuator (not shown) to control and move the panel-assembly-engagement arrangement 894 such that the pre-heating sub-arrangement 896 may be moved into contact with the intermediate panel assembly 203. According to various embodiments, the actuator may move the panel-assembly-engagement arrangement 894 based on a movement-control signal. According to various embodiments, the pre-heating sub-arrangement 896 may provide heating based on a heating-control signal.

According to various embodiments, the panel-assembly-engagement arrangement 894 may include an attachment sub-arrangement 898 to attach the intermediate panel assembly 203 to the panel-assembly-engagement arrangement 894. Accordingly, when the first carrier 204 of the intermediate panel assembly 203 is attached to the panel-assembly-engagement arrangement 894 via the attachment sub-arrangement 898, the intermediate panel assembly 203 may be held by or retained on the panel-assembly-engagement arrangement 894. Accordingly, actuating and moving the panel-assembly-engagement arrangement 894 may move the intermediate panel assembly 203 attached thereto. According to various embodiments, the attachment sub-arrangement 898 of the panel-assembly-engagement arrangement 894 may include vacuum suction mechanism such as vacuum holes or vacuum cups, or gripping mechanism such as grippers or clamps, or magnetic mechanism such as electro-magnets. According to various embodiments, the attachment sub-arrangement 898 of the panel-assembly-engagement arrangement 894 may be configured to hold or retain the intermediate panel assembly 203 to the panel-assembly-engagement arrangement 894. According to various embodiments, the attachment sub-arrangement 898 of the panel-assembly-engagement arrangement 894 may be in direct interaction with the first carrier 204 of the intermediate panel assembly 203. According to various embodiments, the attachment sub-arrangement 898 may be operated based on an attachment-control signal.

According to various embodiments, the panel-assembly-engagement arrangement 894 may be operable to pre-heat the intermediate panel assembly 203 to the intermediate temperature below the predetermined temperature. According to various embodiments, the pre-heating sub-arrangement 896 of the panel-assembly-engagement arrangement 894 may be configured to gradually heat the intermediate panel assembly 203 to the intermediate temperature. Accordingly, the pre-heating sub-arrangement 896 may cause a temperature of the intermediate panel assembly 203 gradually increase over a pre-determined period of time.

According to various embodiments, the conveying arrangement 150 may be configured to move the intermediate panel assembly 203 from the pre-heating workstation 890 to the release workstation 110 when the intermediate panel assembly 203 is heated to the intermediate temperature. According to various embodiments, the conveying arrangement 150 may include a mobile pre-heating table 853 laterally translatable between the pre-heating workstation 890 and the release workstation 110. According to various embodiments, the mobile pre-heating table 853 may include a pre-heating table-top 855 capable of receiving the intermediate panel assembly 203. According to various embodiments, the mobile pre-heating table 853 may be moved based on a conveying-control signal. According to various embodiments, the pre-heating table-top 855 may provide heating based on a heating-control signal. Accordingly, the intermediate panel assembly 203 may be placed on the pre-heating table-top 855 of the mobile pre-heating table 853. According to various embodiments, the pre-heating table-top 855 may cooperatively heat the intermediate panel assembly 203 together with the pre-heating sub-arrangement 896 of the panel-assembly-engagement arrangement 894 of the pre-heating unit 892 when the intermediate panel assembly 203 is sandwiched in between the pre-heating table-top 855 of the mobile pre-heating table 853 and the pre-heating sub-arrangement 896 of the panel-assembly-engagement arrangement 894. According to various embodiments, the mobile pre-heating table 853 may be actuated to move between the pre-heating workstation 890 and the release workstation 110.

According to various embodiments, the mobile pre-heating table 853 of the conveying arrangement 150 may include an attachment sub-arrangement 857 to attach the intermediate panel assembly 203 to the mobile pre-heating table 853. Accordingly, when the intermediate panel assembly 203 is attached to the mobile pre-heating table 853, via the attachment sub-arrangement 858, the intermediate panel assembly 203 may be held by or retained on the mobile pre-heating table 853. According to various embodiments, the attachment sub-arrangement 857 of the mobile pre-heating table 853 may include vacuum suction mechanism such as vacuum holes or vacuum cups, or gripping mechanism such as grippers or clamps. According to various embodiments, the attachment sub-arrangement 857 of the mobile pre-heating table 853 may be configured to hold or retain the intermediate panel assembly 203 to the mobile pre-heating table 853 in a manner such that the intermediate panel assembly 203 may not fall off the mobile pre-heating table 853 when being moved from the pre-heating workstation 890 to the release workstation 110. According to various embodiments, the attachment sub-arrangement 857 may be operated based on an attachment-control signal.

FIG. 9A to FIG. 9D shows schematic diagrams illustrating additional steps to the method of automated processing of the molded panel 202 of FIG. 2A to FIG. 2F based on the automation line 800 of FIG. 8 according to various embodiments.

Figure 9A:
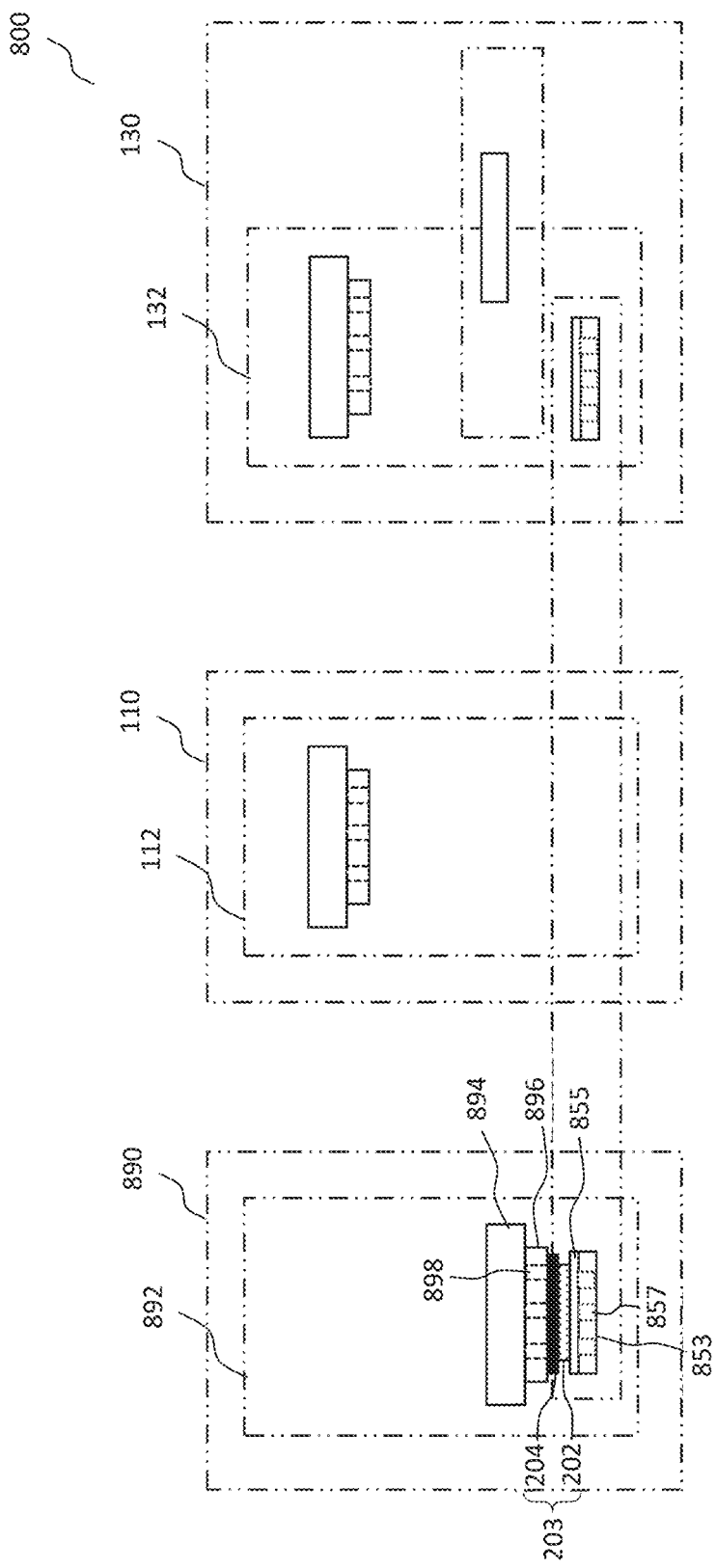
FIG. 9A to FIG. 9D shows schematic diagrams illustrating additional steps to the method of automated processing of the molded panel of FIG. 2A to FIG. 2F based on the automation line FIG. 8 according to various embodiments.

As shown in FIG. 9A, according to various embodiments, the method may additionally include pre-heating the intermediate panel assembly 203 in an orientation with the first carrier 204 on a topside in the pre-heating unit 892 of the pre-heating workstation 890 of the automation line 800 to the intermediate temperature, which is below the pre-determined temperature whereby the adhesive strength of the thermal release adhesive between the molded panel 202 and the first carrier 204 is weaken or reduced. According to various embodiments, during pre-heating, the pre-heating sub-arrangement 896 of the panel-assembly-engagement arrangement 894 of the pre-heating unit 892 may be in thermal contact with the intermediate panel assembly 203 for pre-heating. According to various embodiments, during pre-heating, the intermediate panel assembly 203 may be supported on and in thermal contact with the pre-heating table top 855 of the mobile pre-heating table 853, and the pre-heating table-top 855 may cooperatively heat the intermediate panel assembly 203 together with the pre-heating sub-arrangement 896 of the panel-assembly-engagement arrangement 894.

Figure 9B:
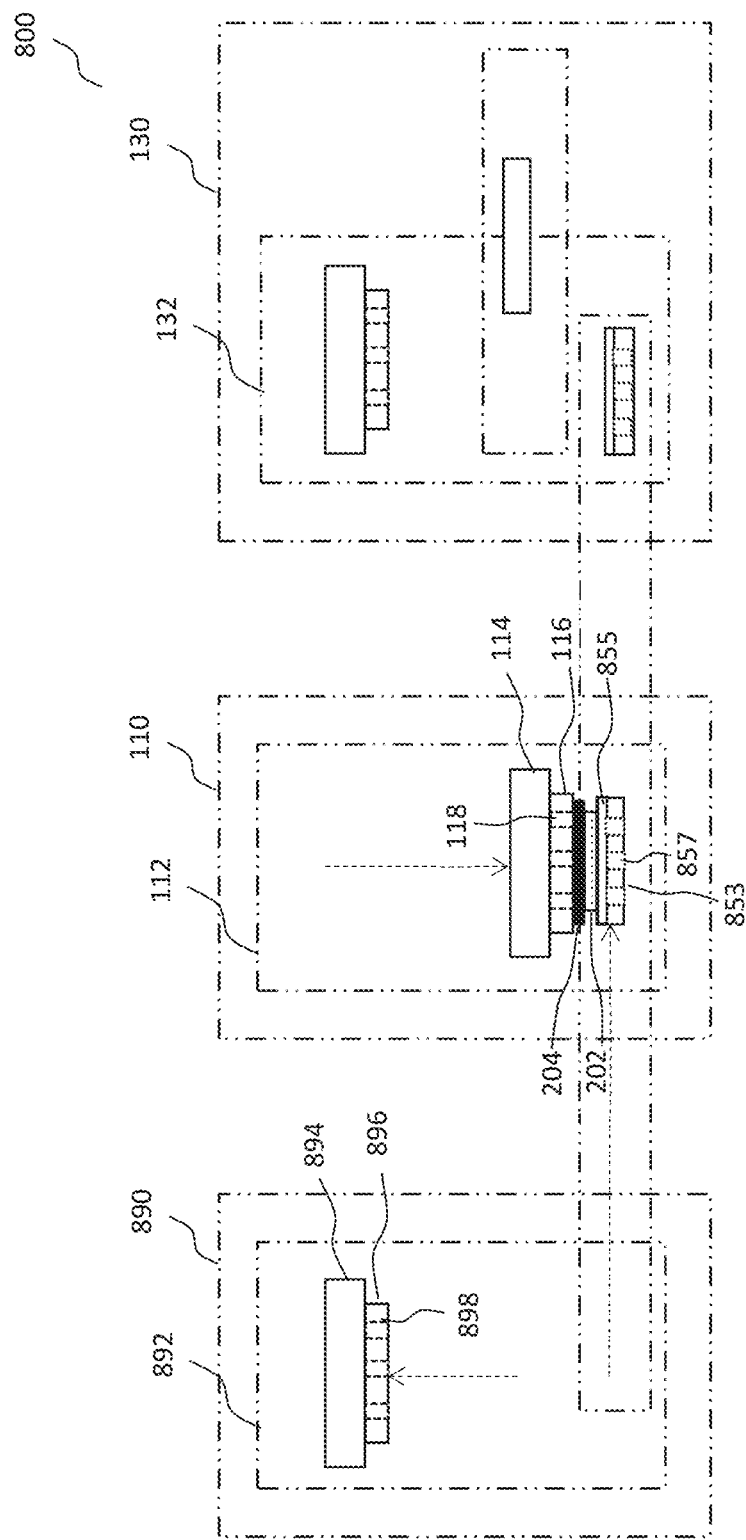

As shown in FIG. 9B, according to various embodiments, the method may additionally include moving the intermediate panel assembly 203 from the pre-heating workstation 890 to the release workstation 110 via the mobile pre-heating table 853. According to various embodiments, during movement of the mobile pre-heating table 853, the intermediate panel assembly 203 may remain attached to the mobile pre-heating table 853 via the attachment sub-arrangement 857 of the mobile pre-heating table 855. According to various embodiments, during movement of the mobile pre-heating table 855, the intermediate panel assembly 203 may also remain in thermal contact with the pre-heating table top 855 of the mobile pre-heating table 853 such that the pre-heating table top 855 may continue to heat or maintain the temperature of the intermediate panel assembly 203 close to or at the intermediate temperature.

Figure 9C:
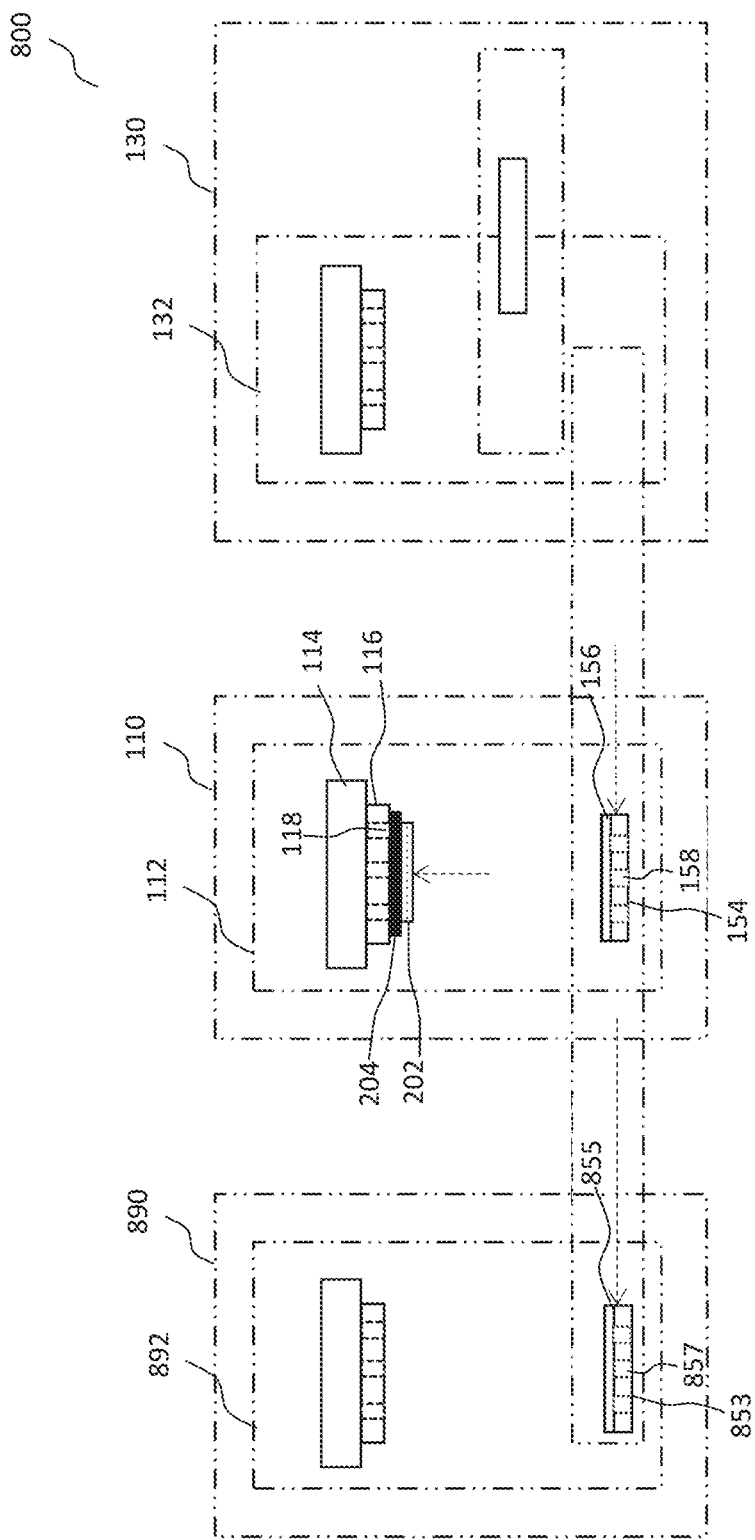

As shown in FIG. 9C, according to various embodiments, the method may additionally include lifting the intermediate panel assembly 203 in the release unit 112 of the release workstation 110 by attaching the intermediate panel assembly 203 to the carrier-engagement arrangement 114 via the attachment sub-arrangement 118 of the carrier-engagement arrangement 114, and moving the carrier-engagement arrangement 114 away from the mobile pre-heating table 853. Accordingly, the attachment sub-arrangement 118 may hold the intermediate panel assembly 203 such that moving the carrier-engagement arrangement 114 may lift the intermediate panel assembly 203. According to various embodiments, the mobile pre-heating table 853 may be moved back to the pre-heating workstation 890 and the mobile heating table 154 may be moved into the release workstation 110.

Figure 9D:
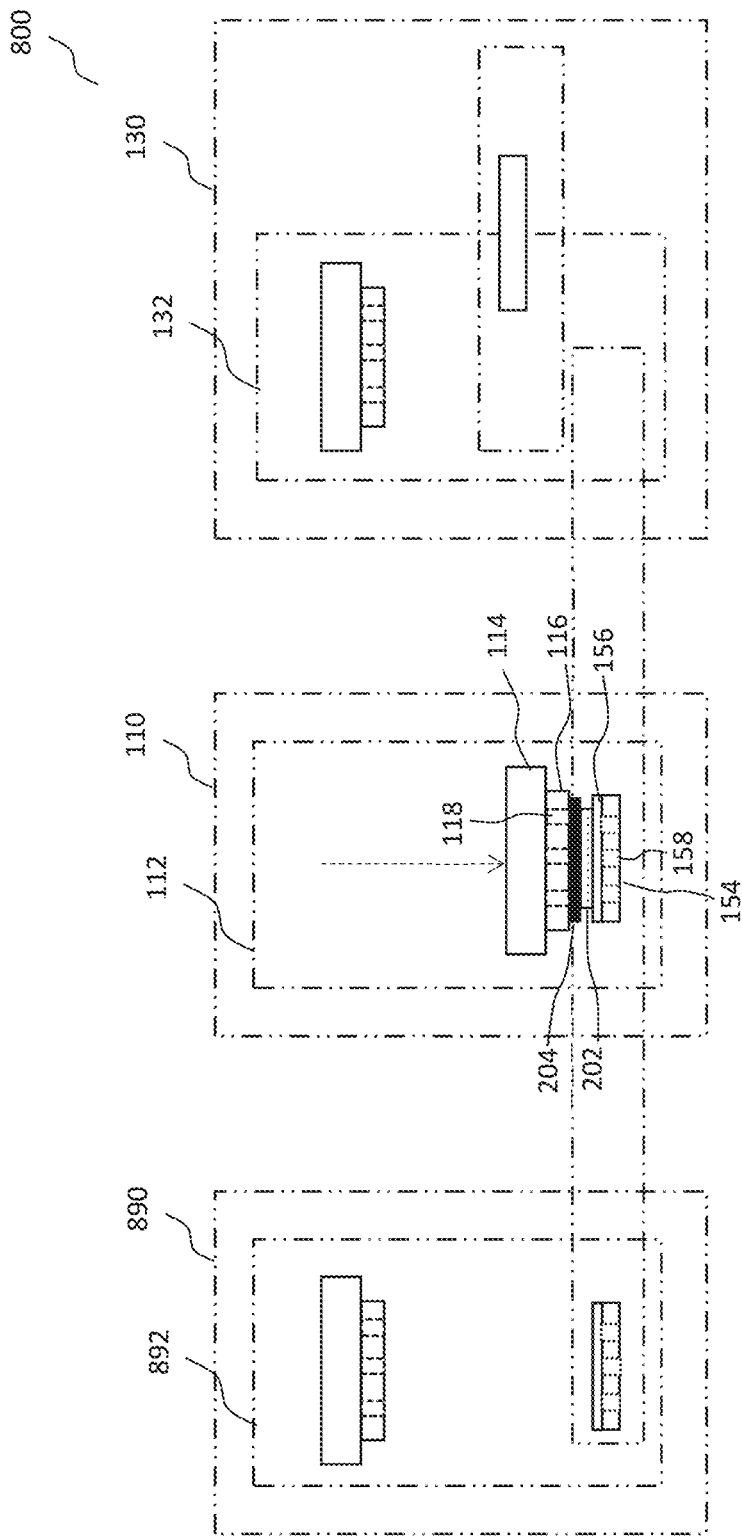

As shown in FIG. 9D, according to various embodiments, the method may additionally include lowering the carrier-engagement arrangement 114 with the intermediate panel assembly 203 onto the mobile heating table 154 such that the intermediate panel assembly 203 is sandwiched between the carrier-engagement arrangement 114 and the mobile heating table 154. Accordingly, in this disposition, the method may continue with the steps as illustrated in FIG. 2A to FIG. 2E.

Figure 10:
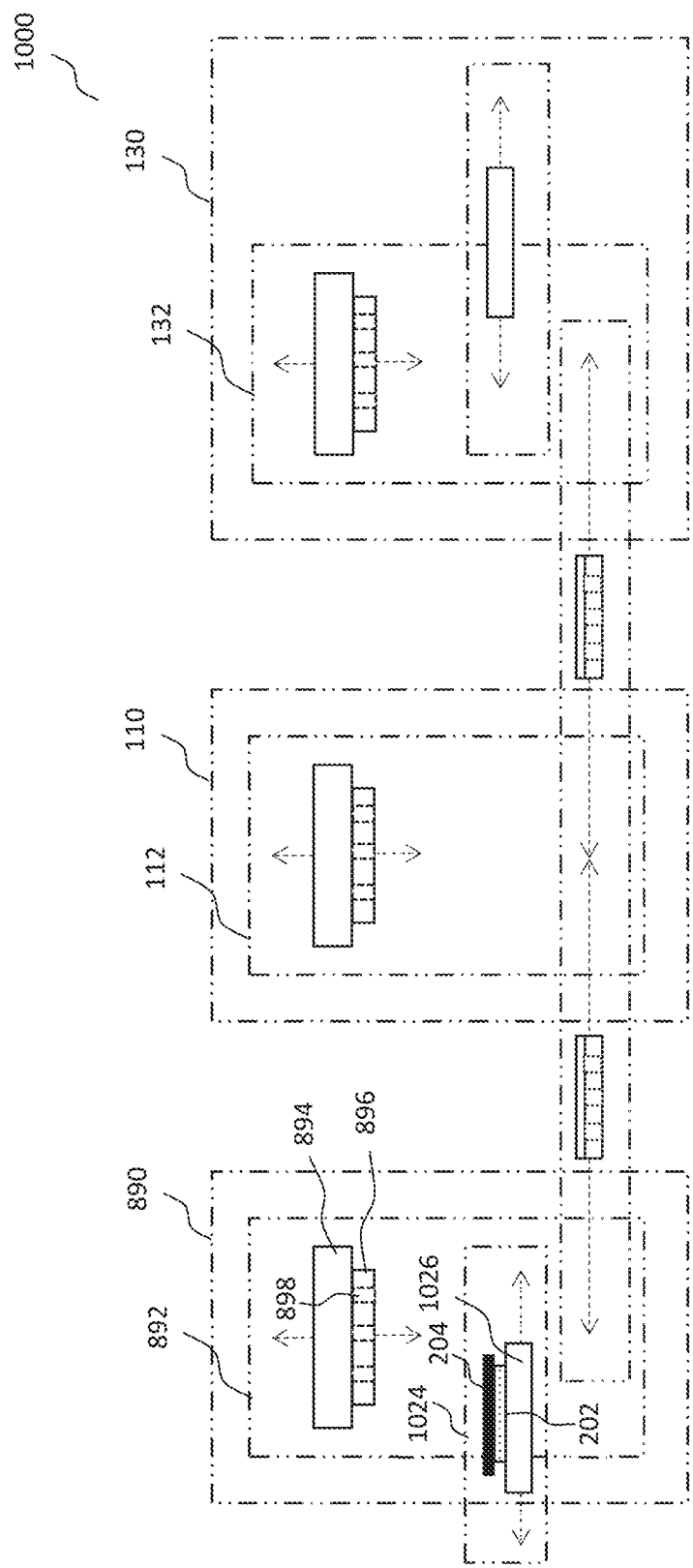
FIG. 10 shows an automation line for processing a molded panel according to various embodiments.

FIG. 10 shows an automation line 1000 for processing the molded panel 202 according to various embodiments. According to various embodiments, processing the molded panel 202 may include releasing a molded panel 202 which is attached, via thermal release adhesive, to a first carrier 204, and transferring the molded panel 202 to a second carrier 206 according to various embodiments. According to various embodiments, the automation line 1000 of FIG. 10 differs from the automation line 800 of FIG. 8 in that the automation line 1000 of FIG. 10 may further include the following.

According to various embodiments, the automation line 1000 of FIG. 10 may further include a panel-assembly-feeder unit 1024 capable of delivering the intermediate panel assembly 203 into the pre-heating workstation 890. According to various embodiments, the panel-assembly-feeder unit 1024 may be configured to deliver or sent the intermediate panel assembly 203 into the pre-heating workstation 890. According to various embodiments, the panel-assembly-feeder unit 1024 may include a panel-assembly-feeding tray 1026 movable into and out of the pre-heating unit 892 of the pre-heating workstation 890. According to various embodiments, the panel-assembly-feeding tray 1026 may be laterally translatable for moving into and out of the pre-heating unit 892. According to various embodiments, the intermediate panel assembly 203 may be placed on the panel-assembly-feeding tray 1026 which is then actuated and moved into the pre-heating unit 892. In the pre-heating unit 892, the panel-assembly-engagement arrangement 894 may be actuated and moved to pick up the intermediate panel assembly 203 and to place the intermediate panel assembly 203 on the mobile pre-heating table 853. According to various embodiments, the panel-assembly-feeding tray 1026 may be moved based on a movement-control signal. According to various embodiments, while not being shown in the drawings, the panel-assembly-feeding tray 1026 of the panel-assembly-feeder unit 1024 may be movable along a movement plane parallel to that of the mobile pre-heating table 853 of the conveying arrangement 150 translating between the pre-heating workstation 890 and the release workstation 110. According to various embodiments, while not being shown in the drawings, a feeding-movement-direction of the panel-assembly-feeding tray 1026 of the panel-assembly-feeder unit 1024 may be perpendicular to a translating-movement-direction of the mobile pre-heating table 853 of the conveying arrangement 150.

Figure 11:
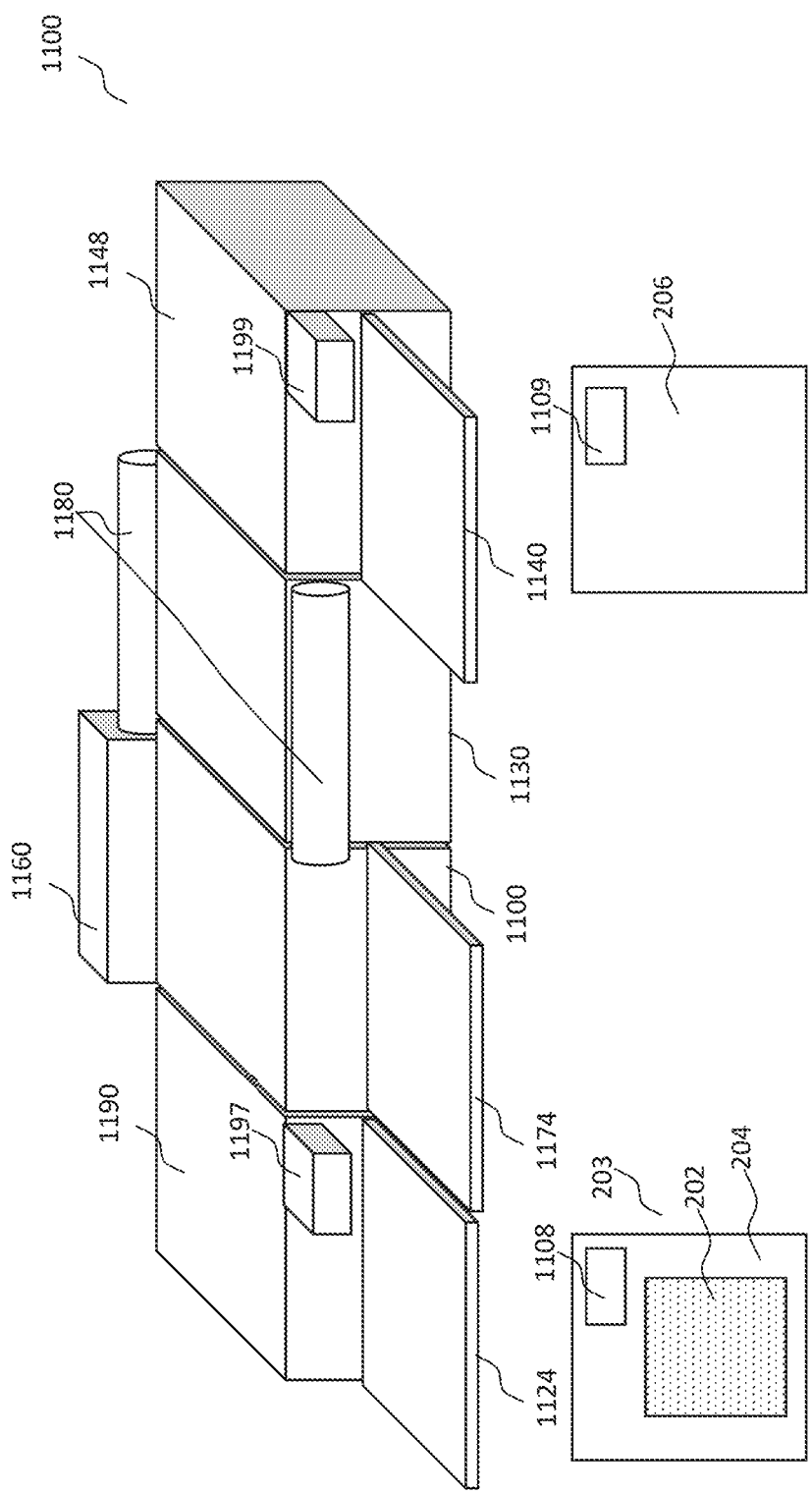
FIG. 11 shows a schematic perspective diagram of an automation line according to various embodiments.

FIG. 11 shows a schematic perspective diagram of an automation line 1100 according to various embodiments. According to various embodiments, there is provided a release and transfer automation line 1100 (or automated machine or machine). The automation line 1100 may include a pre-heating workstation 1190 (or a pre-heat station) including a pre-heating unit (for example, see 892 in FIG. 8) resembling a press unit with a hotplate (or a pre-heating sub-arrangement, for example see 896 in FIG. 8) on top for warming up an intermediate panel assembly 203 (or a workpiece) of a molded panel 202 on a first carrier 204, a vacuum/gripper unit (or an attachment sub-arrangement, for example see 898 in FIG. 8) for securing and handling the intermediate panel assembly 203, and a panel-assembly-feeder unit 1124. The automation line 1100 may further include a release workstation 1110 (or a release station) including a release unit (for example see 112 in FIG. 1) resembling a press unit with hotplate (or a heating sub-arrangement, for example see 116 in FIG. 1)) on top for heating the intermediate panel assembly 203 to a release temperature of a heat release film (or a thermal release adhesive sheet) between the molded panel 202 and the first carrier 204, a vacuum/gripper unit (or an attachment sub-arrangement, for example see 118 in FIG. 1) for securing and handling the intermediate panel assembly 203, a peeling unit 1160 (or an adhesive removal unit) to peel away the film after being heat released, a static discharge unit (or a static neutralizer, for example see 368 in FIG. 3A) to eliminate any static charge build up during the peeling process, a film disposing unit (or an adhesive disposal unit, for example see 370 in FIG. 3B) and a carrier removal unit 1174. The automation line 1100 may further include a transfer workstation 1130 (or a transfer station) including a transfer unit (for example see 132 in FIG. 1) resembling a press unit with hot plate (or a step-down-heating sub-arrangement, for example see 136 in FIG. 1)), with vacuum suction mechanism, on top having a lower temperature than the release temperature to step down the heat of the separated molded panel, a vacuum/gripper unit (or an attachment sub-arrangement, for example see 138 in FIG. 1) mounted on the top of the press unit and a roller arrangement 1180 (or a protective film dispenser unit) for applying a protective film on an exposed side of the molded panel 202 for protecting the active surface of the semiconductor electronic elements. According to various embodiments, the transfer process may take place in a high vacuum environment to ensure a void free transfer. According to various embodiments, the automation line 1100 may further include an offloading workstation 1148 (or offloading station) including a transporter unit 1140 (for example see 140 in FIG. 1) for transporting a second carrier 206 into the automation line 1100 such that the molded panel 202 may be adhered thereon. The offloading unit 1148 may than transport an assembly of the second carrier 206 and molded panel 202 out of the automation line 1100. According to various embodiments, the automation line 1100 may further include three movable bottom hotplates (or a conveying arrangement, for example see 150 in FIG. 1 and FIG. 8) with vacuum mechanism for processing and transporting the assemblies and panels between the above four stations.

According to various embodiments, the first carrier 204 carrying the molded panel 202 into the automation line 1100 may have a first barcode 1108 (or a first machine-readable-code) which is associated with information of the molded panel 202 stored in a server. In other words, the information of the molded panel 202 is pre-encoded into the first barcode 1108, thus the first barcode 1108 contains the information of the molded panel 202. Accordingly, the intermediate panel assembly of the molded panel 202 and the first carrier 204 is loaded into the pre-heating workstation 1190, the first barcode 1108 may be scanned and the information of the molded panel 202 may be retrieved from the server. According to various embodiments, the second carrier 206 (or a transfer carrier) may have a second barcode 1109 (or a second machine-readable-code). When the second carrier 206 is loaded into the offloading workstation 1148, the second barcode 1109 may be scanned and the information of the molded panel 202 may be associated with the second barcode 1109. In other words, the information of the molded panel 202 is encoded into the second barcode 1109, thus the information of the molded panel 202 is stored into the second barcode 1109. According to various embodiments, the pre-heating workstation 1190 may include a first barcode reader 1197 (or a first machine-readable-code scanner) and the offloading workstation 1148 may include a second barcode reader 1199 (or a second machine-readable-code scanner). According to various embodiments, each of the first barcode reader 1197 and the second barcode reader 1199 may provide a detection signal representative of the barcode detected.

According to various embodiments, there is provided a method of performing release and transfer with the automation line 1100. According to various embodiments, the method may include a pre-heating step.

In the pre-heating step, the intermediate panel assembly 203 (or the workpiece) is transferred into the pre-heating workstation 1190 by the panel-assembly-feeder unit 1124. According to various embodiments, the intermediate panel assembly 203 may include the molded panel 202 containing electronic elements (or a plurality of small blocks of silicon or other semiconductor material) mounted active surface down on a heat release film (or a thermal release adhesive sheet) to the first carrier 204, which may be made of steel or steel alloy material. Further, during the pre-heating step, a pre-heating press (or a panel-assembly-engagement arrangement, for example see 894 of FIG. 8) of the pre-heating workstation 1190 receives the intermediate panel assembly 203 by mechanical means. Afterwhich, the panel-assembly-feeder unit 1124 is then retracted. Subsequently, the intermediate panel assembly 203 is lowered onto a bottom pre-heating table (or a mobile pre-heating table, for example see 853 of FIG. 8). Accordingly, the intermediate panel assembly 203 is then held between the two hotplates, i.e. of the pre-heating press and the bottom pre-heating table, for a predetermined time. According to various embodiments, this process is to warm up the intermediate panel assembly 203 before subjecting to a high temperature needed for the release process. According to various embodiments, this step minimizes the effect of thermal shock on the molded panel 202. According to various embodiments, once the predetermined time is reached, the pre-heating press retracts leaving the intermediate panel assembly 203 on the bottom pre-heating table. The molded panel side of the intermediate panel assembly 203 may be held by vacuum to the bottom pre-heating table. Following which, the bottom pre-heating table moves into the release workstation 1110 and positions under a release press (or a carrier-engagement arrangement, for example see 114 of FIG. 1) of the release workstation 1110.

According to various embodiments, the method may further include a release step. The release step may commence when the intermediate panel assembly 203 is transported into the release unit of the release workstation 1110 by the bottom pre-heating table. In the release step, the release press receives the intermediate panel assembly 203 by mechanical means. Afterwhich, the bottom pre-heating table retracts and a bottom release table (or a mobile heating table, for example see 154 of FIG. 1) moves in. The intermediate panel assembly 203 is then lowered onto the bottom release table. Accordingly, the intermediate panel assembly 203 is then held between the two hotplates, i.e. of the release press and the bottom release table, for a predetermined time. During this period of time, both hotplates are heated to a temperature necessary for releasing the heat release film. According to various embodiments, this process is to heat up the intermediate panel assembly 203 to release the molded panel 202 from first carrier 204. According to various embodiments, once the predetermined time is reached, the release press retracts with the first carrier 204 leaving the molded panel 202 on the bottom release table together with the heat release film. The molded panel 202 may be held by vacuum to the bottom release table. In this state, the heat release film may be ready for peeling.

According to various embodiments, the method may further include a peeling step. The peeling step may commence when the molded panel 202 with the heat release film is held on the bottom release table. In the peeling step, a peeling gripper (or an adhesive removal tool, for example see 362 of FIG. 3A) moves to an edge of the molded panel 202. The gripper catches the heat release film by mechanical means (for example, via a blade may push excess film into the gripper fingers, or via vacuum cup, or others). Subsequently, the gripper retracts at a predetermined speed and height to peel the heat release film away to ensure no crack or shift on the molded panel 202 during this movement, thereby exposing the active surface of the electronic elements of the molded panel 202. An ionizer (or a static neutralizer, for example see 368 of FIG. 3A) moves synchronized with the gripper's direction of movement to ensure an ionized effect is concentrated and/or directed at an interface of the heat release film and the molded panel 202. Once film peeling is completed, the gripper continues to move to a disposing location where the peeled films are collected. The bottom release table holding the molded panel 202 with silicon active surface exposed then moves under the transfer press. In addition, the first carrier 204 on the release press is placed on another feeding unit (or a carrier removal unit, for example see 374 of FIG. 3B) to transport the first carrier 204 out of the release workstation 1110 and subsequently offloaded. According to various embodiments, the first carrier may be recycled or reused.

According to various embodiments, the method may further include a transfer step. However, prior to executing the transfer step, the method may include a transfer press preparation step. In order for the silicon active surface to be protected during the handover to a transfer press (or a molded-panel-engagement arrangement 134) of the transfer workstation 1130, the transfer workstation is equipped with a protective film unit (or a protective film dispenser unit, for example see 580 of FIG. 5) which periodically indexes to supply a fresh protective film. The protective film should have some porosity such that the transfer press may hold the molded panel 202 by means of vacuum thru the protective film. According to various embodiments, the transfer workstation 1130 may enable the use of a standard low cost protective film according to the following transfer press preparation step. The protective film first indexes. Vacuum is then turn on and the protective film is sucked into the vacuum grooves, thereby the contour of the vacuum grooves appear on the other side of the protective film. Subsequently, holes are punched into specific locations which are connected to another vacuum source. According to various embodiments, the transfer press may include a vacuum mechanism (or an attachment sub-arrangement, for example see 138 of FIG. 1). The vacuum mechanism may include multiple lines of vacuum holes. For example, two or three or four or more lines of vacuum holes. The multiple lines of vacuum holes may be configured to suck the molded panel 202 as well as the protective film. The vacuum holes may be arranged in an upper transfer hot plate (or a step-down-heating sub-arrangement, for example see 136 of FIG. 1) of the transfer press. In an embodiment with three lines of vacuum holes, the vacuum holes of the left-most line and the right-most line may be configured to suck the molded panel 202 for providing greater suction force. The vacuum holes of the middle line may be configured to suck the protective film. In order to for the vacuum holes of the left-most and right-most line to suck the molded panel 202, the protective film at the locations corresponding to the vacuum holes is pierced by a prod device or needle (or a plurality of puncturing prods, for example see 589 of FIG. 5). According to various embodiments, the prod device may be arranged on one side of the bottom release table. Accordingly, in the transfer press preparation step, after a new segment of protective film is provided by the roller indexer to the upper transfer hot plate, the bottom release hotplate moves the prod device under either the left-most line or the right-most line of the vacuum holes. Then the prods are injected to pierce the protective film. Next, the bottom release hotplate moves the prod device under the other line of the vacuum holes and pierces the protective film again. According to various embodiments, the prod device may include a plurality of piercing units. Each piercing unit may correspond to one vacuum hole of the left-most line or the right-most line. With the transfer press prepped, the transfer step may proceed.

In the transfer step, the transfer press descends and makes contact with the molded panel 202 and receives the molded panel 202 by vacuum. Afterwhich, the bottom release table retracts. The transfer press has lower heat to step down the heat of the molded panel 202 and initiate the cooling process. Meanwhile, a second carrier 206 laminated with heat release tape is transported into a bottom transfer table (or a transporter tray, for example see 142 of FIG. 1) by means of a feeding unit and/or gripper. The bottom transfer table moves under the Transfer Press. A vision system (or an alignment guidance arrangement, for example 644 of FIG. 6) checks for relative offsets in position between the second carrier 206 and the molded panel 202. The vision system makes correction to the relative positions. The molded panel 202 is then lowered onto the bottom transfer table and contacts a rubber seal (or a seal, for example see 743 of FIG. 7). According to various embodiments, the transfer press is configured to float on or suspended by the rubber seal. When vacuum is turned on, the transfer press collapses and compresses the rubber seal thereby allowing the molded panel 202 to make precise contact to the second carrier 206. The molded panel 202 is then held between the two plates, i.e. of the transfer press and the bottom transfer table, under high vacuum for a predetermined time for a void free attachment. Once the predetermined time is reached, the transfer press retracts leaving the molded panel 202 transferred on the second carrier 206 on the bottom transfer table. The bottom transfer table then retracts and the transferred panel assembly is transported out of the automation line 1100.

According to various embodiments, the automation line 100, 300, 500, 600, 700, 800, 1000, 1100 may include a processor. In various embodiments, a "processor" may be understood as any kind of a logic implementing entity, which may be special purpose circuitry or a processor executing software stored in a memory, firmware, or any combination thereof. Thus, in an embodiment, a "processor" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "processor" may also be a processor executing software, e.g. any kind of computer program, e.g. a computer program using a virtual machine code such as e.g. Java. Any other kind of implementation of the respective functions which will be described in more detail below may also be understood as a "processor" in accordance with various embodiments. In various embodiments, the processor may be part of a computing system or a controller or a microcontroller or any other system providing a processing capability. According to various embodiments, such systems may include a memory which is for example used in the processing carried out by the device or system. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

According to various embodiments, the processor may be configured to generate the various control signals, such as movement-control signal, heating-control signal, attachment-control signal, conveying-control signal, discharge-control signal, pusher-control signal, reel-control signal, vacuum-generation-control signal, etc. for operating the various components of the respective automation line 100, 300, 500, 600, 700, 800, 1000, 1100. According to various embodiments, the processor may be configured to generate the various control signals so as to operate the respective automation line 100, 300, 500, 600, 700, 800, 1000, 1100 in accordance to the various methods as described herein. According to various embodiments, the processor may be configured to generate the various control signals in a pre-determined sequence based on the various methods as described herein. According to various embodiments, the processor may receive the various detection signals from the various components (such as the adhesive detector 366 or the alignment guidance arrangement 644), process the various detection signals, and generate corresponding control signals in response to the various detection signals for controlling various components of the respective automation line 100, 300, 500, 600, 700, 800, 1000, 1100. According to various embodiments, the processor may also receive detection signals from the first barcode reader 1197 and the second barcode reader 1199, and process the detection signals for decoding information from the barcode and/or encoding information to the barcode.

The following examples pertain to various embodiments.

Example 1 is an automation line for processing a molded panel, the automation line including (1) a release workstation capable of receiving an intermediate panel assembly, which includes the molded panel attached to a first carrier via thermal release adhesive, wherein the intermediate panel assembly is in an orientation with the first carrier on a topside, the release workstation including (a) a release unit including a carrier-engagement arrangement movable to engage the first carrier, the carrier-engagement arrangement having (i) a heating sub-arrangement to thermally contact the first carrier and (ii) an attachment sub-arrangement to attach the first carrier to the carrier-engagement arrangement, wherein the carrier-engagement arrangement is operable to heat the intermediate panel assembly to a release temperature of the thermal release adhesive and to separate the first carrier from the molded panel.

In Example 2, the subject matter of Example 1 may optionally include (1) a transfer workstation capable of receiving the separated molded panel from the release workstation, the transfer workstation including (a) a transfer unit including a molded-panel-engagement arrangement movable to engage the separated molded panel, the molded-panel-engagement arrangement having (i) a step-down-heating sub-arrangement to thermally contact the separated molded panel, and (ii) an attachment sub-arrangement to attach the separated molded panel to the molded-panel-engagement arrangement, wherein the molded-panel-engagement arrangement is operable to regulate a temperature of the step-down-heating sub-arrangement between an ambient temperature and the release temperature, and (b) a transporter unit including a transporter tray movable into and out of the transfer unit in a manner so as to carry and position the second carrier underneath the separated molded panel held by the molded-panel-engagement arrangement for placing the separated molded panel on the second carrier; and (2) a conveying arrangement including at least one conveying element movable to carry the separated molded panel from the release workstation to the transfer workstation.

In Example 3, the subject matter of Example 1 or 2 may optionally include that the release workstation may further include an adhesive removal unit including an adhesive removal tool to engage and remove the thermal release adhesive from the molded panel, wherein the adhesive removal tool is movable from a first edge portion of the molded panel to an opposite second edge portion of the molded panel to remove the thermal release adhesive across the molded panel from the first edge portion to the second edge portion.

In Example 4, the subject matter of Example 3 may optionally include that, the adhesive removal tool may include an attachment mechanism to hold an edge portion of a thermal release adhesive sheet of the thermal release adhesive, wherein the attachment mechanism may include a clamping mechanism or a vacuum mechanism.

In Example 5, the subject matter of Example 4 may optionally include that the adhesive removal tool may include an adhesive detector to sense a presence of the edge portion of the thermal release adhesive sheet held within the clamping mechanism of the adhesive removal tool.

In Example 6, the subject matter of Example 5 may optionally include that the adhesive removal unit may further include a static neutralizer associated with the adhesive removal tool to discharge ions at an interface of the molded panel and the thermal release adhesive sheet as the adhesive removal tool moves across the molded panel to peel the thermal release adhesive sheet.

In Example 7, the subject matter of any one of Examples 1 to 6 may optionally include that the attachment sub-arrangement of the carrier-engagement arrangement may include a vacuum suction mechanism, or the subject matter of any one of Examples 2 to 6 may optionally include that the attachment sub-arrangement of each of the carrier-engagement arrangement and the molded-panel-engagement arrangement may include a vacuum suction mechanism.

In Example 8, the subject matter of any one of Examples 1 to 7 may optionally include that the heating sub-arrangement of the carrier-engagement arrangement may include a heating plate, or the subject matter of any one of Examples 1 to 7 may optionally include that each of the heating sub-arrangement of the carrier-engagement arrangement and the step-down-heating sub-arrangement of the molded-panel-engagement arrangement may include a heating plate.

In Example 9, the subject matter of any one of Examples 2 to 8 may optionally include that the molded-panel-engagement arrangement may include an integrated vacuum heating plate having built-in heating elements to serve as the step-down-heating sub-arrangement and a plurality of vacuum holes to serve as the attachment sub-arrangement.

In Example 10, the subject matter of any one of Examples 2 to 9 may optionally include that the transfer workstation may include a protective film dispenser unit which may include (i) a protective film supply reel coupled to a first side of the molded-panel-engagement arrangement of the transfer unit and (ii) a protective film take-up reel coupled to an opposite second side of the molded-panel-engagement arrangement of the transfer unit, wherein a protective film is suspended between the protective film supply reel and the protective film take-up reel across a thermal contact surface of the step-down-heating sub-arrangement of the molded-panel-engagement arrangement.

In Example 11, the subject matter of Example 10 may optionally include that the protective film may include a plurality of holes.

In Example 12, the subject matter of Example 11 may optionally include that the conveying element of the conveying arrangement may include a mobile heating table laterally translatable between the release workstation and the transfer workstation, the mobile heating table may include (a) a heating table-top which is capable of carrying the intermediate panel assembly and which cooperatively heats the intermediate panel assembly together with the heating sub-arrangement of the carrier-engagement arrangement of the release unit, and (b) a protective film puncturing arrangement adjacent to a side of the heating table-top, the protective film puncturing arrangement having a plurality of puncturing prods.

In Example 13, the subject matter of any one of Examples 2 to 10 may optionally include that the conveying element of the conveying arrangement may include a mobile heating table laterally translatable between the release workstation and the transfer workstation, the mobile heating table may include a heating table-top which is capable of carrying the intermediate panel assembly and which cooperatively heats the intermediate panel assembly together with the heating sub-arrangement of the carrier-engagement arrangement of the release unit.

In Example 14, the subject matter of any one of Examples 1 to 13 may optionally include that the transfer workstation may further include (1) an alignment guidance arrangement to guide relative movement between the molded-panel-engagement arrangement of the transfer unit and the transporter tray carrying the second carrier for aligning the separated molded panel and the second carrier during placement of the separated molded panel on the second carrier.

In Example 15, the subject matter of Example 14 may optionally include that the alignment guidance arrangement may include a vision alignment guidance arrangement including an image capturing device coupled to the transporter tray to provide visual feedback of relative offset in position between the separated molded panel and the second carrier for controlling relative movement of the transporter tray and the molded-panel-engagement arrangement to align the separated molded panel and the second carrier.

In Example 16, the subject matter of any one of Examples 1 to 15 may optionally include that, when the molded-panel-engagement arrangement is lowered and in engagement with the transporter tray, the molded-panel-engagement arrangement and the transporter tray cooperatively form a sealed enclosure in a manner such that the sealed enclosure is capable of creating a vacuum environment for void-free placement of the separated molded panel to the second carrier.

In Example 17, the subject matter of Example 16 may optionally include that the transporter tray may include a seal around a periphery portion of the transporter tray.

In Example 18, the subject matter of any one of Examples 2 to 17 may optionally include a pre-heating workstation capable of receiving the intermediate panel assembly in the orientation with the first carrier on a topside, the pre-heating workstation including: a pre-heating unit including a panel-assembly-engagement arrangement movable to engage the intermediate panel assembly, the panel-assembly-engagement arrangement having a pre-heating sub-arrangement to thermally contact the intermediate panel assembly, wherein the pre-heating sub-arrangement is operable to pre-heat the intermediate assembly to an intermediate temperature below the release temperature, wherein the conveying arrangement is configured to move the intermediate panel assembly from the pre-heating workstation to the release workstation.

In Example 19, the subject matter of Example 18 may optionally include that the conveying arrangement may include a mobile pre-heating table laterally translatable between the pre-heating workstation and the release workstation, the mobile pre-heating table may include a pre-heating table-top capable of receiving the intermediate panel assembly.

In Example 20, the subject matter of Example 19 may optionally include a panel-assembly-feeder unit capable of delivering the intermediate panel assembly into the pre-heating workstation.

In Example 21, the subject matter of Example 20 may optionally include that the panel-assembly-engagement arrangement may include an attachment sub-arrangement to hold the intermediate panel assembly, wherein the panel assembly feeder unit may include a feeder tray movable into and out of the pre-heating workstation for delivering the intermediate panel assembly, and wherein the pre-heating unit is operable to lift the intermediate panel assembly using the panel-assembly-engagement arrangement from the feeder tray and to place the intermediate panel assembly on the mobile pre-heating table to cooperatively pre-heat the intermediate panel assembly together with the panel-assembly-engagement arrangement.

Example 22 is a method of automated processing a molded panel, the method including: heating an intermediate panel assembly, which includes the molded panel attached to a first carrier in an orientation with the first carrier on a topside, in a release unit of a release workstation to a release temperature of the thermal release adhesive, wherein a heating sub-arrangement of a carrier-engagement arrangement of the release unit is in thermal contact with the first carrier of the intermediate panel assembly to heat the first carrier; and separating the first carrier from the molded panel by attaching the first carrier to the carrier-engagement arrangement via an attachment sub-arrangement of the carrier-engagement arrangement and moving the carrier-engagement arrangement away from the molded panel.

In Example 23, the subject matter of Example 22 may optionally include moving the separated molded panel from the release workstation to a transfer workstation via at least one conveying element of a conveying arrangement; lifting the separated molded panel in a transfer unit of a transfer workstation by attaching the separated molded panel to a molded-panel-engagement arrangement via an attachment sub-arrangement of the molded-panel-engagement arrangement and moving the molded-panel-engagement arrangement away from the at least one conveying element of the conveying arrangement; moving the second carrier to position underneath the separated molded panel held by the molded-panel-engagement arrangement via a transporter tray of a transporter unit of the transfer workstation; and placing the separated molded panel on the second carrier by moving the molded-panel-engagement arrangement towards the transporter tray.

In Example 24, the subject matter of Example 23 may optionally include operating a step-down-heating sub-arrangement so as to be in thermal contact with the molded panel in the transfer unit of the transfer workstation to regulate a temperature of the molded panel between an ambient temperature and the release temperature.

In Example 25, the subject matter of any one of Examples 22 to 24 may optionally include removing the thermal release adhesive from the molded panel by engaging an adhesive removal tool of an adhesive removal unit of the release workstation with the thermal release adhesive and moving the adhesive removal tool across the molded panel from the first edge portion of the molded panel to a second edge panel of the molded panel.

In Example 26, the subject matter of Example 25 may optionally include that, removing the thermal release adhesive may include clamping an edge portion of a thermal release adhesive sheet of the thermal release adhesive via a clamping mechanism of the adhesive removal tool and peeling the thermal release adhesive sheet by moving the adhesive removal tool across the molded panel.

In Example 27, the subject matter of Example 26 may optionally include that removing the thermal release adhesive may further include discharging ions, via a static neutralizer, at an interface of the molded panel and the thermal release adhesive sheet as the adhesive removal tool moves to peel the thermal release adhesive sheet.

In Example 28, the subject matter of any one of Examples 23 to 27 may optionally include dispensing and suspending a protective film between a protective film supply reel coupled to a first side of the molded-panel-engagement arrangement of the transfer unit and a protective film take-up reel coupled to an opposite second side of the molded-panel-engagement arrangement of the transfer unit so as to suspend the protective film across a thermal contact surface of the step-down-heating sub-arrangement of the molded-panel-engagement arrangement of the transfer unit.

In Example 29, the subject matter of Example 28 may optionally include puncturing a plurality of holes in the protective film by moving the molded-panel-engagement arrangement of the transfer unit to engage with a protective film puncturing arrangement having a plurality of puncturing prods.

In Example 30, the subject matter of any one of Examples 23 to 29 may optionally include that placing the separated molded panel on the second carrier may include aligning the separated molded panel and the second carrier guided by an alignment guidance arrangement of the transfer workstation.

In Example 31, the subject matter of any one of Examples 23 to 30 may optionally include that placing the separated molded panel on the second carrier may include creating a vacuum environment for void-free placement of the separated molded panel to the second carrier, wherein the molded-panel-engagement arrangement when lowered and in engagement with the transporter tray cooperatively form a sealed enclosure for creating the vacuum environment.

In Example 32, the subject matter of any one of Examples 22 to 31 may optionally include: pre-heating the intermediate panel assembly in an orientation with the first carrier on a topside in a pre-heating unit of a pre-heating workstation to an intermediate temperature below the release temperature, wherein a pre-heating sub-arrangement of a panel-assembly-engagement arrangement of the pre-heating unit is in thermal contact with the intermediate panel assembly; and moving the pre-heated intermediate panel assembly from the pre-heating workstation to the release workstation.

In Example 33, the subject matter of Example 32 may optionally include that delivering the intermediate panel assembly into the pre-heating workstation via a panel-assembly-feeder unit.

In Example 34, the subject matter of any one of Examples 22 to 33 may optionally include scanning a first machine readable code marked on the first carrier to retrieve information on the molded panel, and scanning a second machine readable code marked on the second carrier to associate the information on the molded panel to the second machine readable code.

Example 35 is a method of forming a molded panel including a plurality of electronic elements and exposing active surfaces of the plurality of electronic elements for subsequent processing in a panel level packaging process, the method including: providing a first steel alloy carrier; disposing a thermal release adhesive layer on the first steel alloy carrier; placing the plurality of electronic elements at pre-determined locations on the thermal release adhesive layer with respective active surface flat against the thermal release adhesive layer; molding over the plurality of electronic elements on the first steel alloy carrier with encapsulation material to form a molded panel on the first steel alloy carrier; heating the molded panel and the first steel alloy carrier to a release temperature of the thermal release adhesive layer; releasing the first steel alloy carrier from the molded panel; and transferring the molded panel to a second steel alloy carrier with the molded panel oriented in a manner such that the active surfaces of the plurality of electronic elements are facing away from the second steel alloy carrier.

Various embodiments have provided an automation line, system and method for large molded panel release from a carrier to expose the active surface of the silicon, followed by transfer to another carrier without flipping the molded panel and still keeping the active surface exposed for circuit making process. Various embodiments involve pre-heating an intermediate panel assembly (or a workpiece) including a molded panel on a first carrier, process heating the intermediate panel assembly to a release temperature, detach the molded panel from the first carrier using vacuum and flat chucks and precise motion control, removal of heat release film from the molded panel while preventing any static build up, transfer to a second carrier (or another carrier) under high vacuum, while stepping down the temperature. Various embodiments have provided film peeling without shifting or damaging the molded panel, with synchronized ionizing to prevent any static build up. Various embodiments have provided protection of the active surface of the molded panel using protective film and unique vacuum holding of the molded panel. Various embodiments have provided transferring with camera guided alignment between the molded panel and the second carrier along with precise position control. Various embodiments have provided transferring under high vacuum to eliminate air trap between the contact surfaces. Various embodiments have provided temperature step down to minimize stress and warpage. Various embodiments have provided warpage management by controlled temperature at pre-heat, release and transfer steps.

Various embodiments have provided a multistage heating system and cooling system to gradually heat up and cool down the panel(s). Accordingly, there is minimal or no thermal shock, minimal or no cumulated internal stress and minimal or no warpage. In various embodiments, there is no need to flip the panel during the release and transfer process. Therefore, there is no complicated mechanical and minimal or no damage to the fragile panel. Various embodiments have provided a precision vacuum system coupled with controlled motion such that the molded panel is gently released from the steel carrier. Various embodiments have provided an alignment vision system in transfer station to transfer the panel into the transfer carrier with the alignment. Accordingly, the vision system checks for relative offsets is position between the second steel carrier and molded panel, and the system makes correction to the relative positions. Various embodiments have provided a film peeling unit which ensure minimal or no static discharge during the film peeling process by applying the static discharge unit which is preferable mounted on the feeder moving synchronized with the gripper axis to ensure the ionized effect is concentrated at the interface of the film and the molded panel. Various embodiments have provided a protective film supplied by the roller indexer during the transfer process to ensure minimal or no damage to the active surface. Various embodiments have provided a sensor which is provided in the grip and which is configured for checking if the film stays in the grip. Various embodiments have provided bar code on the carrier for storing information.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. An automation line for processing a molded panel, the automation line comprising:
   (A) a release workstation capable of receiving an intermediate panel assembly, which comprises the molded panel attached to a first carrier, wherein the intermediate panel assembly is in an orientation with the first carrier on a topside, the release workstation comprising
      (1) a release unit including
         (a) a carrier-engagement arrangement movable to engage the first carrier, the carrier-engagement arrangement comprising
            (i) a heating sub-arrangement to thermally contact the first carrier, and
            (ii) an attachment sub-arrangement to attach the first carrier to the carrier-engagement arrangement,
         wherein the carrier-engagement arrangement is operable to heat the intermediate panel assembly to a release temperature of a thermal release adhesive and to separate the first carrier from the molded panel;
   (B) a transfer workstation capable of receiving the separated molded panel from the release workstation, the transfer workstation comprising
      (1) a transfer unit including (a) a molded-panel-engagement arrangement movable to engage the separated molded panel, the molded-panel-engagement arrangement comprising
  (i) a step-down-heating sub-arrangement to thermally contact the separated molded panel, and
  (ii) an attachment sub-arrangement to attach the separated molded panel to the molded-panel-engagement arrangement,
  wherein the molded-panel-engagement arrangement is operable to regulate a temperature of the step-down-heating sub-arrangement between an ambient temperature and the release temperature, and
(b) a transporter unit including
  (i) a transporter tray movable into and out of the transfer unit in a manner so as to carry and position a second carrier underneath the separated molded panel held by the molded-panel-engagement arrangement for placing the separated molded panel on the second carrier; and
(C) a conveying arrangement comprising
  (1) at least one conveying element movable to carry the separated molded panel from the release workstation to the transfer workstation.

2. The automation line as claimed in claim 1, wherein the release workstation further comprises (2) an adhesive removal unit including
(a) an adhesive removal tool to engage and remove the thermal release adhesive from the molded panel,
wherein the adhesive removal tool is movable from a first edge portion of the molded panel to an opposite second edge portion of the molded panel to remove the thermal release adhesive across the molded panel from the first edge portion to the second edge portion.

3. The automation line as claimed in claim 2, wherein the adhesive removal tool comprises an attachment mechanism to hold an edge portion of a thermal release adhesive sheet of the thermal release adhesive, wherein the attachment mechanism comprises a clamping mechanism or a vacuum mechanism.

4. The automation line as claimed in claim 3, wherein the adhesive removal tool comprises an adhesive detector to sense a presence of the edge portion of the thermal release adhesive sheet held within the attachment mechanism of the adhesive removal tool.

5. The automation line as claimed in claim 4, wherein the adhesive removal unit further comprises
(b) a static neutralizer associated with the adhesive removal tool to discharge ions at an interface of the molded panel and the thermal release adhesive sheet as the adhesive removal tool moves across the molded panel to peel the thermal release adhesive sheet.

6. The automation line as claimed in claim 1, wherein the attachment sub-arrangement of each of the carrier-engagement arrangement and the molded-panel-engagement arrangement comprises a vacuum suction mechanism.

7. The automation line as claimed in claim 1, wherein each of the heating sub-arrangement of the carrier-engagement arrangement and the step-down-heating sub-arrangement of the molded-panel-engagement arrangement comprises a heating plate.

8. The automation line as claimed in claim 1, wherein the transfer workstation further comprises
(2) a protective film dispenser unit which comprises
  (i) a protective film supply reel coupled to a first side of the molded-panel-engagement arrangement of the transfer unit and
  (ii) a protective film take-up reel coupled to an opposite second side of the molded-panel-engagement arrangement of the transfer unit,
  wherein a protective film is suspended between the protective film supply reel and the protective film take-up reel across a thermal contact surface of the step-down-heating sub-arrangement of the molded-panel-engagement arrangement.

9. The automation line as claimed in claim 8, wherein the protective film comprises a plurality of holes.

10. The automation line as claimed in claim 9, wherein the at least one conveying element of the conveying arrangement comprises
(a) a mobile heating table laterally translatable between the release workstation and the transfer workstation, the mobile heating table comprises
  (i) a heating table-top which is capable of carrying the intermediate panel assembly and which cooperatively heats the intermediate panel assembly together with the heating sub-arrangement of the carrier-engagement arrangement of the release unit, and
  (ii) a protective film puncturing arrangement adjacent to a side of the heating table-top, the protective film puncturing arrangement comprising a plurality of puncturing prods.

11. The automation line as claimed in claim 1, wherein the transfer workstation further comprises
(3) an alignment guidance arrangement to guide relative movement between the molded-panel-engagement arrangement of the transfer unit and the transporter tray carrying the second carrier for aligning the separated molded panel and the second carrier during placement of the separated molded panel on the second carrier.

12. The automation line as claimed in claim 1, wherein, when the molded-panel-engagement arrangement is lowered and in engagement with the transporter tray, the molded-panel-engagement arrangement and the transporter tray cooperatively form a sealed enclosure in a manner such that the sealed enclosure is capable of creating a vacuum environment for void-free placement of the separated molded panel to the second carrier.

13. The automation line as claimed in claim 12, wherein the transporter tray comprises a seal around a periphery portion of the transporter tray.

14. The automation line as claimed in claim 1, further comprising
(D) a pre-heating workstation capable of receiving the intermediate panel assembly in the orientation with the first carrier on a topside, the pre-heating workstation comprising
  (1) a pre-heating unit including
    (a) a panel-assembly-engagement arrangement movable to engage the intermediate panel assembly, the panel-assembly-engagement arrangement comprising
      (i) a pre-heating sub-arrangement to thermally contact the intermediate panel assembly, wherein the pre-heating sub-arrangement is operable to pre-heat the intermediate assembly to an intermediate temperature below the release temperature,
  wherein the conveying arrangement is configured to move the intermediate panel assembly from the pre-heating workstation to the release workstation.

15. The automation line as claimed in claim 14, wherein the conveying arrangement comprises (2) a mobile pre-heating table laterally translatable between the pre-heating workstation and the release workstation, and the mobile pre-heating table comprises
   (a) a pre-heating table-top capable of receiving the intermediate panel assembly.

16. The automation line as claimed in claim 15, further comprising
   (E) a panel-assembly-feeder unit capable of delivering the intermediate panel assembly into the pre-heating workstation.

17. The automation line as claimed in claim 16,
   wherein the panel-assembly-engagement arrangement further comprises
      (ii) an attachment sub-arrangement to hold the intermediate panel assembly,
   wherein the panel assembly unit comprises
      (1) a feeder tray movable into and out of the pre-heating workstation for delivering the intermediate panel assembly, and
   wherein the pre-heating unit is operable to lift the intermediate panel assembly using the panel-assembly-engagement arrangement from the feeder tray and to place the intermediate panel assembly on the mobile pre-heating table to cooperatively pre-heat the intermediate panel assembly together with the panel-assembly-engagement arrangement.

18. A method of automated processing of a molded panel using the automation line as claimed in claim 1, the method comprising:
   heating an intermediate panel assembly, which comprises the molded panel attached to a first carrier in an orientation with the first carrier on a topside, in a release unit of a release workstation to a release temperature of the thermal release adhesive, wherein a heating sub-arrangement of a carrier-engagement arrangement of the release unit is in thermal contact with the first carrier of the intermediate panel assembly to heat the first carrier; and
   separating the first carrier from the molded panel by attaching the first carrier to the carrier-engagement arrangement via an attachment sub-arrangement of the carrier-engagement arrangement and moving the carrier-engagement arrangement away from the molded panel.

19. The method of claim 18, further comprising:
   moving the separated molded panel from the release workstation to a transfer workstation via at least one conveying element of a conveying arrangement;
   lifting the separated molded panel in a transfer unit of a transfer workstation by attaching the separated molded panel to a molded-panel-engagement arrangement via an attachment sub-arrangement of the molded-panel-engagement arrangement and moving the molded-panel-engagement arrangement away from the at least one conveying element of the conveying arrangement;
   moving the second carrier to position underneath the separated molded panel held by the molded-panel-engagement arrangement via a transporter tray of a transporter unit of the transfer workstation; and
   placing the separated molded panel on the second carrier by moving the molded-panel-engagement arrangement towards the transporter tray.

\* \* \* \* \*

UNITED STATES PATENT AND TRADEMARK OFFICE
CERTIFICATE OF CORRECTION

PATENT NO. : 11,107,716 B1  
APPLICATION NO. : 16/783385  
DATED : August 31, 2021  
INVENTOR(S) : Sen Page 1 of 1

It is certified that error appears in the above-identified patent and that said Letters Patent is hereby corrected as shown below:

In the Claims

Column 35 Claim 17 Line 17, delete "assembly unit" and insert --assembly feeder unit--.

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*